United States Patent
Kim et al.

(10) Patent No.: US 11,532,361 B2
(45) Date of Patent: Dec. 20, 2022

(54) NON-VOLATILE MEMORY DEVICE, STORAGE DEVICE INCLUDING THE SAME, AND READ METHOD THEREOF

(71) Applicant: SAMSUNG ELECTRONICS CO., LTD., Suwon-si (KR)

(72) Inventors: Minseok Kim, Hwaseong-si (KR); Hyunggon Kim, Hwaseong-si (KR)

(73) Assignee: SAMSUNG ELECTRONICS CO., LTD., Su Won-si (KR)

( * ) Notice: Subject to any disclaimer, the term of this patent is extended or adjusted under 35 U.S.C. 154(b) by 0 days.

(21) Appl. No.: 17/380,289

(22) Filed: Jul. 20, 2021

(65) Prior Publication Data
US 2022/0130463 A1   Apr. 28, 2022

(30) Foreign Application Priority Data
Oct. 23, 2020 (KR) .................. 10-2020-0138431

(51) Int. Cl.
| | |
|---|---|
| *G11C 16/10* | (2006.01) |
| *G11C 16/26* | (2006.01) |
| *G11C 16/08* | (2006.01) |
| *G11C 16/24* | (2006.01) |
| *G11C 16/30* | (2006.01) |
| *G11C 7/10* | (2006.01) |

(52) U.S. Cl.
CPC ............ *G11C 16/102* (2013.01); *G11C 7/109* (2013.01); *G11C 7/1039* (2013.01); *G11C 7/1063* (2013.01); *G11C 16/08* (2013.01); *G11C 16/24* (2013.01); *G11C 16/26* (2013.01); *G11C 16/30* (2013.01)

(58) Field of Classification Search
CPC ... G11C 16/102; G11C 7/1039; G11C 7/1063; G11C 7/109; G11C 16/08; G11C 16/24; G11C 16/26; G11C 16/30
See application file for complete search history.

(56) References Cited

U.S. PATENT DOCUMENTS

| | | | |
|---|---|---|---|
| 8,199,571 B2 * | 6/2012 | Mokhlesi | G11C 16/3418 365/185.17 |
| 8,248,858 B2 | 8/2012 | Kang | |
| 8,270,227 B2 | 9/2012 | Park et al. | |
| 8,467,248 B2 * | 6/2013 | Aritome | G11C 16/3427 365/185.24 |
| 8,665,643 B2 | 3/2014 | Kim et al. | |
| 8,811,094 B2 * | 8/2014 | Lee | G11C 16/3418 365/185.29 |
| 8,902,664 B2 * | 12/2014 | Harada | G11C 16/10 365/185.02 |
| 9,721,652 B2 * | 8/2017 | Puthenthermadam | G11C 11/5671 |

(Continued)

*Primary Examiner* — Tri M Hoang
(74) *Attorney, Agent, or Firm* — F. Chau & Associates, LLC

(57) ABSTRACT

A non-volatile memory device receives a read command and an address from a controller, and performs a data recovery read operation in response to the read command. In the data recovery read operation, an operation of obtaining aggressor group information from a memory cell connected to a word line adjacent to a word line selected according to the address, and an operation of recovering data corresponding to the obtained aggressor group information in a memory cell connected to the word line selected according to the address, are repeatedly performed on each of a plurality of aggressor groups.

20 Claims, 24 Drawing Sheets

(56) References Cited

U.S. PATENT DOCUMENTS

| | | | |
|---|---|---|---|
| 10,056,152 B2 | 8/2018 | Hahn et al. | |
| 10,127,985 B2 * | 11/2018 | Yamaoka | G11C 16/16 |
| 10,163,518 B2 | 12/2018 | Yoon et al. | |
| 10,388,356 B2 * | 8/2019 | Lee | G11C 16/08 |
| 2007/0206426 A1 | 9/2007 | Mokhlesi | |
| 2019/0279724 A1 * | 9/2019 | Itoh | G11C 16/26 |
| 2019/0348122 A1 * | 11/2019 | Ko | G11C 16/26 |
| 2020/0098436 A1 * | 3/2020 | Kim | G06F 11/1048 |
| 2021/0012841 A1 * | 1/2021 | Yanagidaira | G11C 16/32 |

* cited by examiner

NON-VOLATILE MEMORY DEVICE, STORAGE DEVICE INCLUDING THE SAME, AND READ METHOD THEREOF

CROSS-REFERENCE TO RELATED APPLICATION(S)

This application claims priority under 35 U.S.C. § 119 to Korean Patent Application No. 10-2020-0138431, filed on Oct. 23, 2020 in the Korean Intellectual Property Office, the disclosure of which is incorporated by reference herein in its entirety.

TECHNICAL FIELD

Exemplary embodiments of the present disclosure relate to a non-volatile memory device, a storage device including the same, and a read method thereof.

DISCUSSION OF RELATED ART

A memory system including a non-volatile memory device has been widely used in devices such as, for example, a universal serial bus (USB) drive, a digital camera, a mobile phone, a smartphone, a tablet personal computer (PC), a PC, a memory card, a solid state drive (SSD), etc. Threshold voltages of multiple programmed memory cells included in such a non-volatile memory device may change due to various causes such as, for example, retention, floating gate coupling, or charge loss with the passage of time. Such a change may deteriorate reliability of read data.

SUMMARY

Exemplary embodiments of the present disclosure may provide a non-volatile memory device that increases data reliability, a storage device including the same, and a read method thereof.

Exemplary embodiments of the present disclosure may provide a non-volatile memory device performing a data recovery operation for a plurality of aggressor groups without increasing an area, a storage device including the same, and a read method thereof.

According to an exemplary embodiment of the present disclosure, a read method of a non-volatile memory device may include applying, in a state in which a read pass voltage is applied to a word line selected according to an address, a first aggressor group read level to at least one word line adjacent to the selected word line, and obtaining first aggressor group information from a memory cell connected to the at least one word line. The read method may further include applying the read pass voltage to the at least one word line, applying a first read level to the selected word line, and performing a first read operation for a first aggressor group. The read method may further include applying, in a state in which the read pass voltage is applied to the selected word line, a second aggressor group read level to the at least one word line, and obtaining second aggressor group information from the memory cell connected to the at least one word line. The read method may further include applying the read pass voltage to the at least one word line, applying a second read level to the selected word line, and performing a second read operation for a second aggressor group. The read method may further include applying the read pass voltage to the at least one word line, applying a third read level to the selected word line, and performing a third read operation.

According to an exemplary embodiment of the present disclosure, a storage device may include at least one non-volatile memory device, and a controller controlling the at least one non-volatile memory device. The at least one non-volatile memory device receives a read command and an address from the controller, and performs a data recovery read operation in response to the read command. In the data recovery read operation, an operation of obtaining aggressor group information from a memory cell connected to a word line adjacent to a word line selected according to the address, and an operation of recovering data corresponding to the obtained aggressor group information in a memory cell connected to the word line selected according to the address, are repeatedly performed on each of a plurality of aggressor groups.

According to an exemplary embodiment of the present disclosure, a non-volatile memory device may include a memory cell area including a first metal pad, a peripheral circuit area including a second metal pad and vertically connected to the first metal pad through the second metal pad, a memory cell array including a plurality of memory blocks that each include a plurality of memory cells connected to a plurality of word lines and a plurality of bit lines in the memory cell area, a row decoder selecting one of the plurality of word lines in the peripheral circuit area, a page buffer circuit including a plurality of page buffers connected to the plurality of bit lines, and a control logic including a data recovery read scheduler performing a data recovery read operation by receiving a command latch enable (CLE) signal, an address latch enable (ALE) signal, a chip enable (CE) signal, a write enable (WE) signal, a read enable (RE) signal, and a data strobe (DQS) signal through control pins, and latching a command or address at an edge of the WE signal according to the CLE signal and the ALE signal, in the peripheral circuit area. In the data recovery read operation, an operation of obtaining aggressor group information from a memory cell connected to a word line adjacent to a word line selected according to the address, and an operation of recovering data corresponding to the obtained aggressor group information in a memory cell connected to the word line selected according to the address, are repeatedly performed on a plurality of aggressor groups.

BRIEF DESCRIPTION OF THE DRAWINGS

The above and other features of the present disclosure will become more apparent by describing in detail exemplary embodiments thereof with reference to the accompanying drawings, in which.

DETAILED DESCRIPTION

Figure 1:
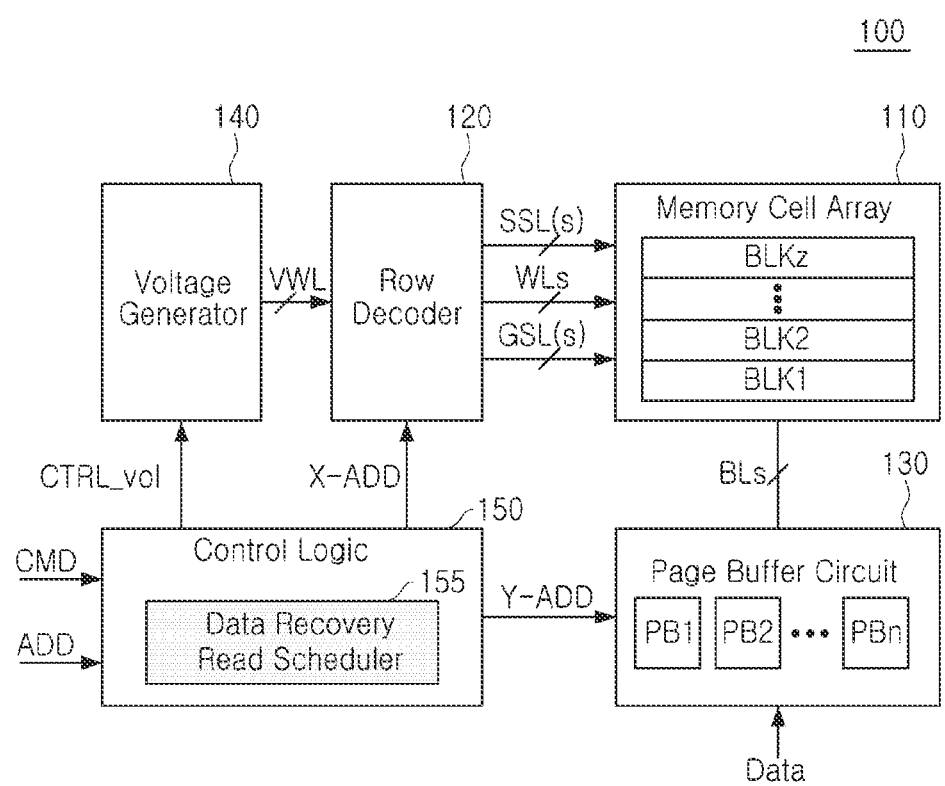
FIG. 1 is a diagram illustrating a non-volatile memory device according to an exemplary embodiment of the present disclosure.

Exemplary embodiments of the present disclosure will be described more fully hereinafter with reference to the accompanying drawings. Like reference numerals may refer to like elements throughout the accompanying drawings.

FIG. 1 is a diagram illustrating a non-volatile memory device 100 according to an exemplary embodiment of the present disclosure.

Referring to FIG. 1, the non-volatile memory device 100 may include a memory cell array 110, a row decoder 120, a page buffer circuit 130, a voltage generator 140, and a control logic 150. In some embodiments, the non-volatile memory device 100 may further include a memory interface circuit. In some embodiments, the non-volatile memory device 100 may further include a column logic, a pre-decoder, a temperature sensor, a command decoder, an address decoder, and the like.

The memory cell array 110 may be connected to the row decoder 120 through word lines (WLs) or select lines (SSL and GSL). The memory cell array 110 may be connected to the page buffer circuit 130 through bit lines (BLs). The memory cell array 110 may include a plurality of cell strings. A channel of each of the cell strings may be formed in a vertical or horizontal direction. Each of the cell strings may include a plurality of memory cells. The plurality of memory cells may be programmed, erased, or read by a voltage provided through the bit lines (BLs) or word lines (WLs).

In general, a programming operation is performed in a page unit, and an erase operation is performed in a block unit. In an example, the memory cell array 110 may include a three-dimensional (3D) memory cell array. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array. In an exemplary embodiment of the present disclosure, the 3D memory array includes vertical NAND strings that are vertically oriented such that at least one memory cell is located over another memory cell. The at least one memory cell may include a charge trap layer. The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

In an example, the memory cell array 110 may include a two-dimensional memory cell array, and the two-dimensional memory cell array may include a plurality of NAND strings arranged in a row direction and a column direction.

The row decoder 120 may be implemented to select one of memory blocks BLK1 to BLKz (z is an integer of 2 or more) of the memory cell array 110 in response to a row address X-ADD. The row decoder 120 may select one of word lines of the memory block selected in response to the row address X-ADD. The row decoder 120 may transfer, to the word line of the selected memory block, a word line voltage VWL corresponding to an operation mode. When performing the programming operation, the row decoder 120 may apply a programming voltage and a verification voltage to a selected word line, and apply a pass voltage to an unselected word line. When performing the read operation, the row decoder 120 may apply a read voltage to a selected word line, and apply a read pass voltage to an unselected word line.

The page buffer circuit 130 may include a plurality of page buffers PB1 to PBn (n is an integer of 2 or more). The plurality of page buffers PB1 to PBn may be connected to the memory cells through corresponding bit lines (BLs), respectively. The page buffer circuit 130 may select at least one of bit lines (BLs) in response to a column address Y-ADD. The page buffer circuit 130 may be operated as a write driver or sense amplifier according to an operation mode. For example, when performing the programming operation, the page buffer circuit 130 may apply, to the selected bit line, a bit line voltage corresponding to data to be programmed. When performing the read operation, the page buffer circuit 130 may sense a current or voltage of the selected bit line to sense data stored in the memory cell.

Each of the plurality of page buffers PB1 to PBn may perform at least one sensing operation to identify a status of one piece of data stored in the selected memory cells under the control of the control logic 150. Further, each of the plurality of page buffers PB1 to PBn may store data sensed through a plurality of sensing operations and then select one piece of data under the control of the control logic 150. That is, each of the page buffers PB1 to PBn may perform a plurality of sensing operations to identify a status of one piece of data. Further, each of the plurality of page buffers PB1 to PBn may select or output an optimal piece of data among the plurality of pieces of sensed data under the control of the control logic 150.

An input/output buffer circuit provides, to the page buffer circuit 130, a piece of data provided from outside of the non-volatile memory device 100. The input/output buffer circuit may provide, to the control logic 150, a command CMD provided from outside of the non-volatile memory device 100. The input/output buffer circuit may provide, to the control logic 150 or row decoder 120, an address ADD provided from outside of the non-volatile memory device 100. In addition, the input/output buffer circuit may output a piece of data sensed and latched by the page buffer circuit 130 to outside of the non-volatile memory device 100. In an example, the input/output buffer circuit may include an error correction circuit that internally performs an error correction function.

The voltage generator 140 may be implemented to generate various types of word line voltages to be applied to the respective word lines under the control of the control logic 150, and well voltages to be supplied to a bulk (for example, a well region) where the memory cells are formed. The word line voltages applied to the respective word lines may include, for example, programming voltages, pass voltages, read voltages, read pass voltages, and the like.

The control logic 150 may be implemented to perform overall control of various operations in the non-volatile memory device 100. The control logic 150 may output various control signals in response to the command CMD and/or address ADD from the memory interface circuit. For example, the control logic 150 may output a voltage control signal CTRL_vol, the row address X-ADD, and the column address Y-ADD.

Further, the control logic 150 may include a data recovery read scheduler 155. The control logic 150 may perform a data recovery read operation using the data recovery read scheduler 155.

The data recovery read scheduler 155 may read information of at least one aggressor group connected to a word line that is adjacent to a word line selected according to the address ADD, and perform a recovery read operation for a memory cell connected to the selected word line on the basis of the read information of the aggressor group. For example, the data recovery read scheduler 155 may store, in a first latch, information of one of a plurality of aggressor groups connected to the adjacent word line, store, in a second latch, data obtained by updating information of aggressor groups sensed up to a current point in time, store, in a third latch, data of a cell connected to the selected word line, and store, in a fourth latch, read data corresponding to the aggressor group using the data stored in the first latch and the data stored in the third latch. The data recovery read scheduler 155 may perform the data recovery read operation while increasing the number of aggressor groups using three latches.

The control logic 150 may perform the read operation using one of a normal read scheduler and the data recovery read scheduler 155.

The control logic 150 may further include a cell counter that counts memory cells corresponding to a specific threshold voltage range from the data sensed by the page buffer circuit 130. For example, the cell counter may count the number of memory cells having threshold voltages in the specific threshold voltage range by processing data sensed by each of the plurality of page buffers PB1 to PBn.

According to a comparative example, a non-volatile memory device recovers data in consideration of a program disturbance on selected word line cells, the program disturbance occurring when an adjacent word line is programmed. The recovery is performed using a different read level when the data recovery read operation is performed, depending on a programming status of each adjacent word line. However, in a case in which information of an aggressor group corresponding to the adjacent word line is increased, an additional storage latch is required in the comparative example, which causes an increase in the size of a page buffer in the comparative example.

In contrast to the comparative example, the non-volatile memory device 100 according to an exemplary embodiment of the present disclosure may perform a data recovery read operation which is capable of unlimitedly increasing the number of aggressor groups for the adjacent word line without requiring an additional latch by appropriately operating the respective latches of the page buffers PB1 to PBn.

Figure 2A:
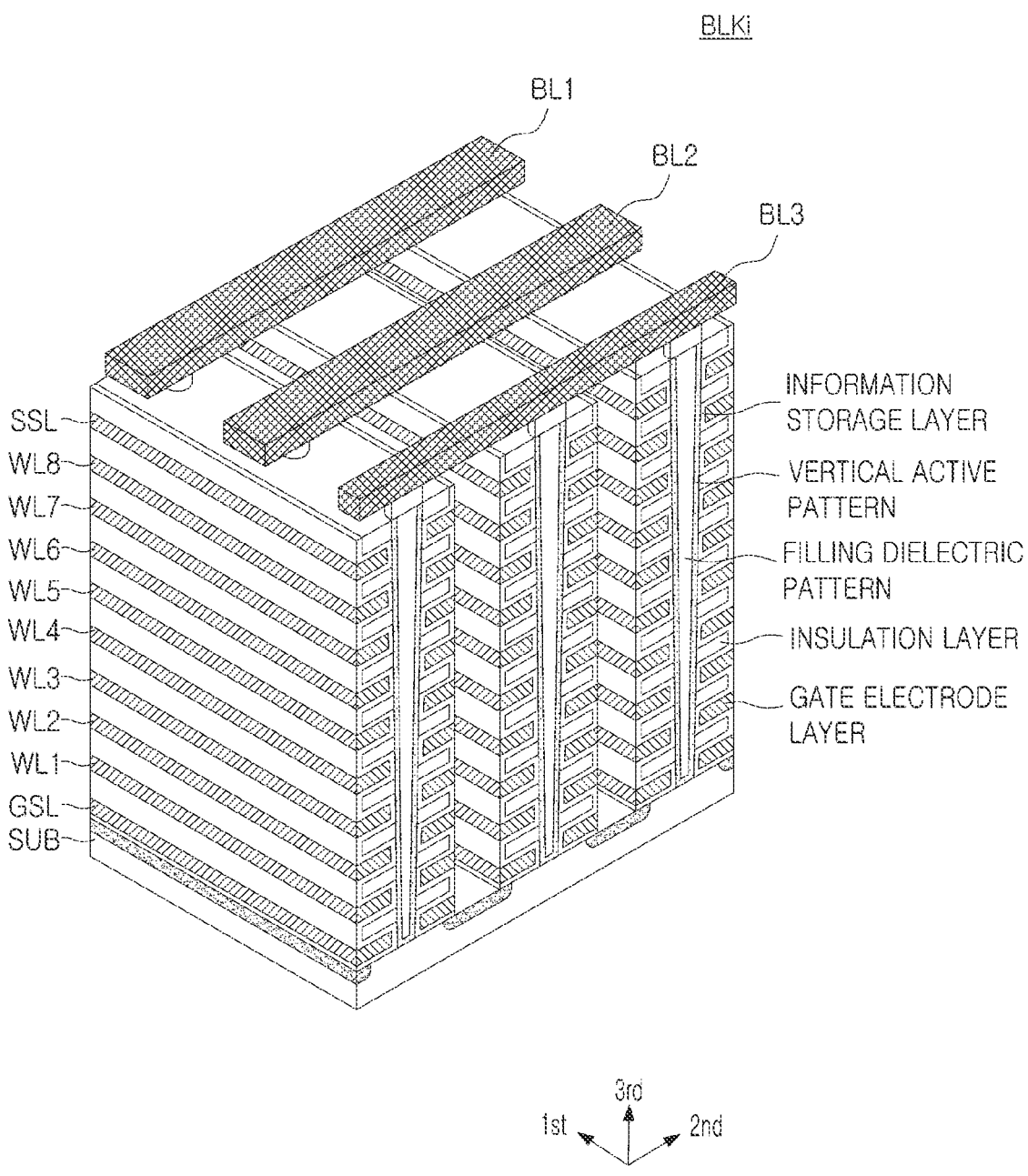
FIGS. 2A and 2B are views illustrating memory blocks according to exemplary embodiments of the present disclosure.

FIG. 2A is a view illustrating a memory block according to an exemplary embodiment of the present disclosure.

Referring to FIG. 2A, a memory block BLKi (i is a positive integer) is formed perpendicular to a substrate SUB. An n+ doped region may be formed in the substrate SUB.

The configuration of the memory block BLKi illustrated in FIG. 2A may apply to any of the memory blocks BLK1 to BLKz of FIG. 1.

A gate electrode layer and an insulation layer may be alternately deposited on the substrate SUB. An information storage layer may be formed between the gate electrode layer and the insulation layer. A V-shaped pillar may be formed by vertically patterning the gate electrode layer and the insulation layer. The pillar may penetrate through the gate electrode layer and the insulation layer and be connected to the substrate SUB. An inner portion of the pillar may be a filling dielectric pattern and may be formed of an insulating material such as, for example, silicon oxide. An outer portion of the pillar may be a vertical active pattern, and may be implemented as a channel semiconductor.

The gate electrode layer of the memory block BLKi may be connected to a ground select line GSL, a plurality of word lines WL1 to WL8, and a string select line SSL. Further, the pillar of the memory block BLKi may be connected to a plurality of bit lines BL1 to BL3 among bit lines BL1 to BL6. Although FIG. 2A illustrates an embodiment in which one memory block BLKi includes two select lines GSL and SSL, eight word lines WL1 to WL8, and three bit lines BL1 to BL3, exemplary embodiments of the present disclosure are not limited thereto.

Figure 2B:
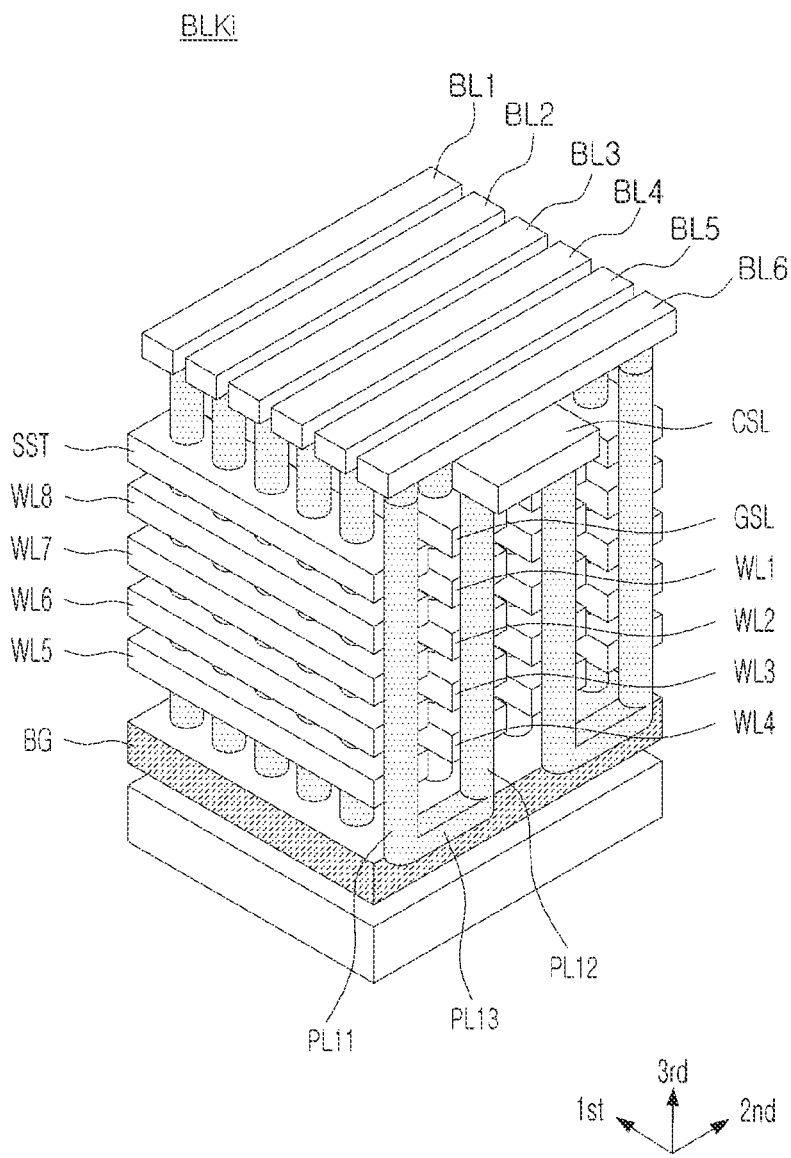

FIG. 2B is a view illustrating a memory block according to an exemplary embodiment of the present disclosure.

Referring to FIG. 2B, a case in which the number of layers of word lines of a memory block BLKi is four is illustrated for convenience of explanation. However, exemplary embodiments of the present disclosure are not limited thereto.

Figure 3:
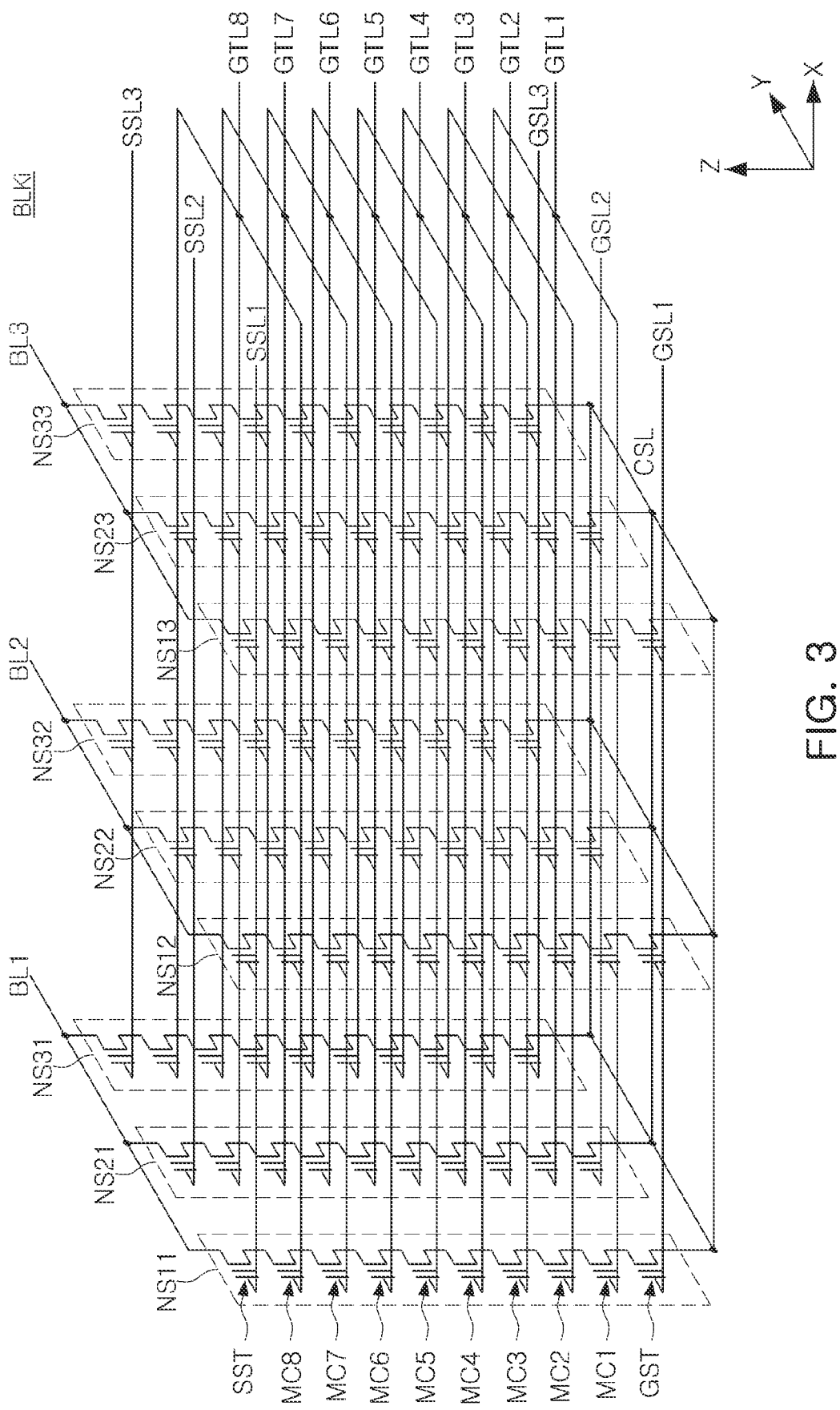
FIG. 3 is a circuit diagram illustrating a memory block according to an exemplary embodiment of the present disclosure.

The configuration of the memory block BLKi illustrated in FIG. 2B may apply to any of the memory blocks BLK1 to BLKz of FIG. 1. FIG. 3 is a circuit diagram illustrating a memory block BLKi according to an exemplary embodiment of the present disclosure. A plurality of NAND memory strings included in the memory block BLKi may be formed perpendicular to the substrate.

The configuration of the memory block BLKi illustrated in FIG. 3 may apply to any of the memory blocks BLK1 to BLKz of FIG. 1.

Referring to FIGS. 2B and 3, a plurality of strings NS11 to NS33 may be included in the memory block BLKi according to exemplary embodiments. Each string may include memory cells MC1 to MC8 connected in series. First upper ends of the memory cells MC1 to MC8 are connected to a string select transistor SST, second upper ends of the memory cells MC1 to MC8 are connected to a ground select transistor GST, and lower ends of the memory cells MC1 to MC8 may be connected to a pipe. The memory cells included in a string may be formed by being stacked on a plurality of semiconductor layers. Each string may include a first pillar PL11, a second pillar PL12, and a pillar connecting portion PL13 connecting the first pillar PL11 and the second pillar PL12. The first pillar PL11 may be connected to a bit line (for example, BL1) and the pillar connecting portion PL13, and penetrate through the string select line SSL and the word lines WL5 to WL8. The second pillar PL12 may be connected to a common source line CSL and the pillar connecting portion PL13, and penetrate through the ground select line GSL and the word lines WL1 to WL4. As illustrated in FIG. 2B, a string may be implemented to have a U-shaped pillar shape.

In an example, a back gate BG is formed on the substrate, and the pillar connecting portion PL13 may be implemented inside the back gate BG. In an example, the back gate BG may exist in the block BLKi in common. The back gate BG may be separate from a back gate of another block.

Referring to FIG. 3, the memory block BLKi may include the plurality of NAND memory strings NS11 to NS33 connected between the bit lines BL1 to BL3 and the common source line CSL. Each of the plurality of NAND memory strings NS11 to NS33 may include the string select transistor SST, the plurality of memory cells MC1 to MC8, and the ground select transistor GST. FIG. 3 illustrates a case in which each of the plurality of NAND memory strings NS11 to NS33 includes eight memory cells MC1 to MC8, but the number of memory cells included in each NAND memory string is not limited thereto.

The string select transistor SST may be connected to a corresponding string select line SSL1, SSL2, or SSL3. The plurality of memory cells MC1 to MC8 may be connected to corresponding gate lines GTL1 to GTL8, respectively. The gate lines GTL1 to GTL8 may correspond to word lines, and some of the gate lines GTL1 to GTL8 may correspond to dummy word lines. The ground select transistor GST may be connected to a corresponding ground select line GSL1, GSL2, or GSL3. The string select transistor SST may be connected to a corresponding bit line BL1, BL2, or BL3, and the ground select transistor GST may be connected to the common source line CSL.

Word lines at the same height (for example, WL1) are connected in common, and the ground select lines GSL, GSL2, and GSL3 and the string select lines SSL1, SSL2, and SSL3 may be separated from each other. FIG. 3 illustrates a case in which the memory block BLKi is connected to eight gate lines GTL1 to GTL8 and three bit lines BL1 to BL3, but the number of gate lines and the number of bit lines are not limited thereto.

Figure 4:
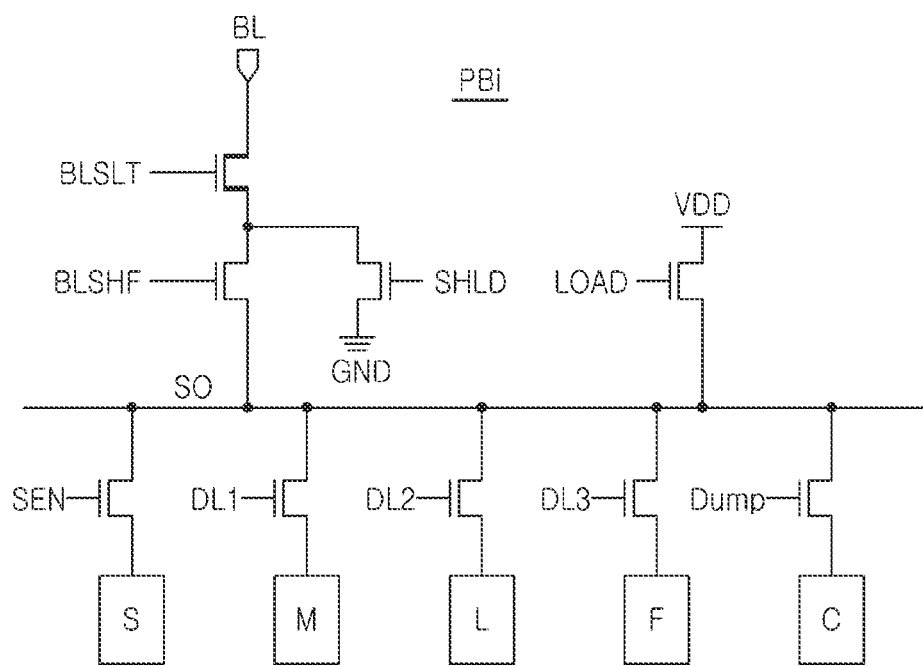
FIG. 4 is a diagram illustrating a page buffer according to an exemplary embodiment of the present disclosure.

FIG. 4 is a diagram illustrating a page buffer PBi (i is a positive integer) according to an exemplary embodiment of the present disclosure.

The configuration of the page buffer PBi illustrated in FIG. 4 may apply to any of the page buffers PB1 to PBn of FIG. 1.

As illustrated in FIG. 4, the page buffer PBi may be connected to a cell string through a bit line BL. When performing the programming operation, the page buffer PBi may set up or pre-charge the bit line BL. When performing the read operation, the page buffer PBi may pre-charge the bit line BL and sense whether a selected memory cell is turned on or off. The page buffer PBi may include transistors for supplying a power voltage VDD to the bit line BL. Further, the page buffer PBi may receive, from the control logic 150, control signals BLSLT, BLSHF, SHLD, and LOAD for controlling the transistors. The bit line BL may be pre-charged and developed in response to such control signals BLSLT, BLSHF, SHLD, and LOAD. Further, data of a sensing node SO corresponding to the bit line BL may be latched in response to switching signals SEN, DL1, DL2, DL3, and Dump.

The page buffer PBi connected to the bit line BL may be connected to memory cells of a NAND cell string as illustrated in FIG. 3. The page buffer PBi may include the sensing node SO connected to the bit line BL. Further, the page buffer PBi may include a plurality of latches S, M, L, F, and C, each connected to the sensing node SO. In an example, when performing the data recovery read operation, the latch S (third latch) may store read data that is read using a read level for an aggressor group, the latch M (first latch) may store information corresponding to a current aggressor group, the latch L (second latch) may store update data for aggressor information, and the latch C (fourth latch) may store final read data to be output to an input/output buffer.

Although the page buffer PBi illustrated in FIG. 4 includes five latches, the number of latches according to exemplary embodiments of the present disclosure are not limited thereto. As described above, the number of latches of the page buffer PBi according to exemplary embodiments of the present disclosure may be at least three.

The page buffer PBi may store a plurality of sensing results in three latches S, M, and L when performing the data recovery read operation. For example, the page buffer PBi may store, in the latch M, information of a first aggressor group corresponding to an adjacent word line, may store, in the latch L, data obtained by updating information of aggressor groups corresponding to the adjacent word line, sensed up to a current point in time, and may store, in the latch S, data of a memory cell corresponding to a selected word line. For the latch operation as described above, the switching signals SEN, DL1, DL2, DL3, and Dump may be controlled by the control logic 150.

Figure 5A:
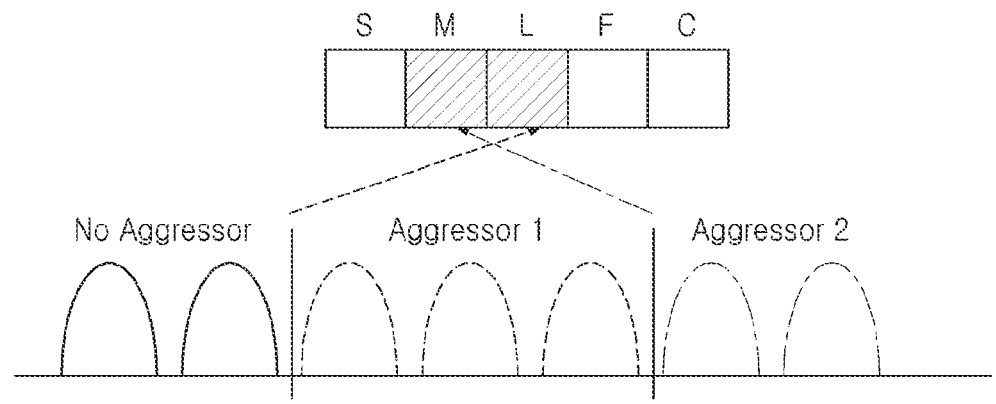
FIGS. 5A and 5B are diagrams illustrating a latch operation when performing a data recovery read operation, in which two aggressor groups are applied, in a general non-volatile memory device according to a comparative example.
Figure 5B:
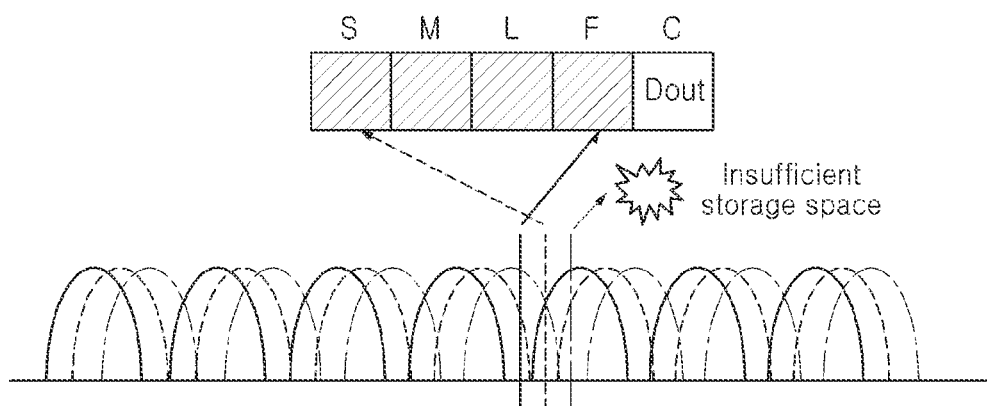

FIGS. 5A and 5B are diagrams illustrating a latch operation when performing a data recovery read operation, in which two aggressor groups are applied in a general nonvolatile memory device according to a comparative example.

As illustrated in FIG. 5A, information of a first aggressor group for an adjacent word line is stored in the latch M, and information of a second aggressor group for the adjacent word line may be stored in the latch L. As illustrated in FIG. 5B, sensing data for three read levels need to be stored for a selected word line, but there is not enough storage space.

Thus, each page buffer requires an additional latch in addition to the existing latches to perform the data recovery read operation in which two aggressor groups are applied according to a comparative example. Such an additional latch causes an increase in layout size of the page buffer.

Pieces of data are read from memory cells experiencing word line coupling from an adjacent word line by changing a recovery read level to be applied to a selected word line or changing a develop time of the sensing node on the basis of a programming status of pieces of data of at least one of word lines adjacent to the selected word line and an operating parameter of the non-volatile memory device, thereby achieving a performance improvement.

Figure 6:
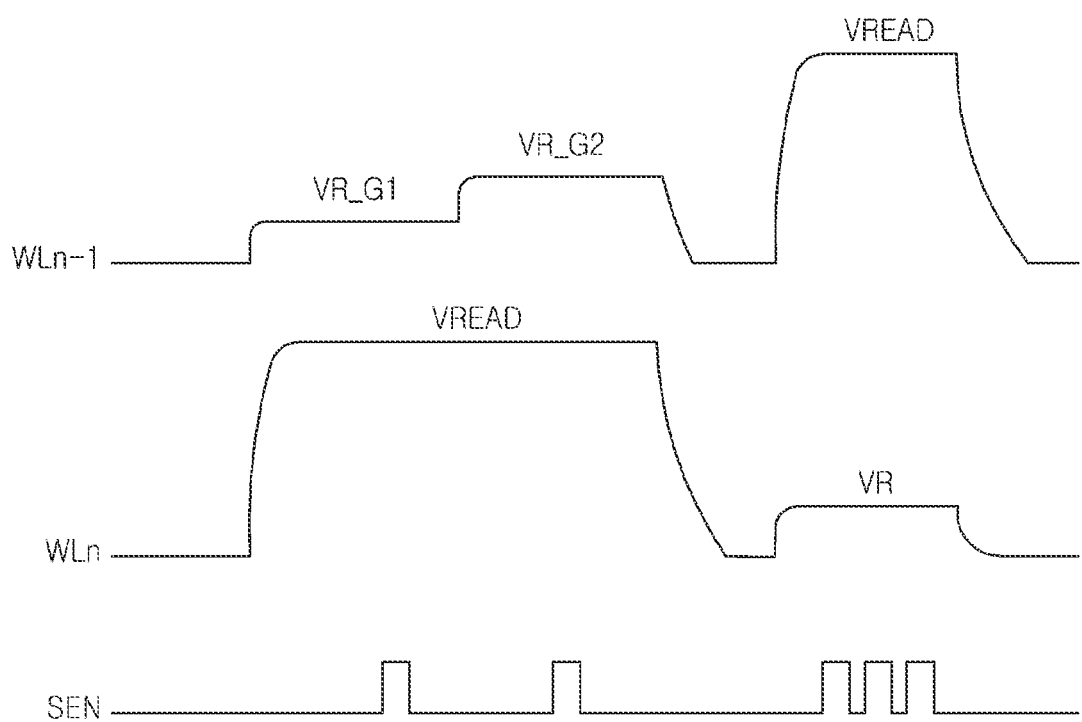
FIG. 6 is a diagram illustrating timings for the data recovery read operation in the general non-volatile memory device according to the comparative example of FIGS. 5A and 5B.

FIG. 6 is a diagram illustrating timings for the data recovery read operation in the general non-volatile memory device according to the comparative example of FIGS. 5A and 5B.

Referring to FIG. 6, information of three groups connected to an adjacent word line WLn−1 may be latched. A sensing operation for each of read levels VR_G1 and VR_G2 of two aggressor groups is performed, and sensed data may be stored in corresponding first latches. A read pass voltage VREAD may be applied to a selected word line.

Thereafter, sensing operations using a read level VR in response to a sensing activation signal SEN may be consecutively performed on a memory cell connected to the selected word line in a state in which the read pass voltage VREAD is applied to the adjacent word line. Results of such sensing operations may be stored in second latches.

The data recovery read operation may be performed using the data stored in the first latches and the data stored in the second latches. In the general non-volatile memory device according to a comparative example, the data recovery read operation using three groups requires at least six latches.

FIGS. 7A through 7E are diagrams illustrating a data recovery read operation, in which two aggressor groups are applied, in the non-volatile memory device 100 according to an exemplary embodiment of the present disclosure.

Figure 7A:
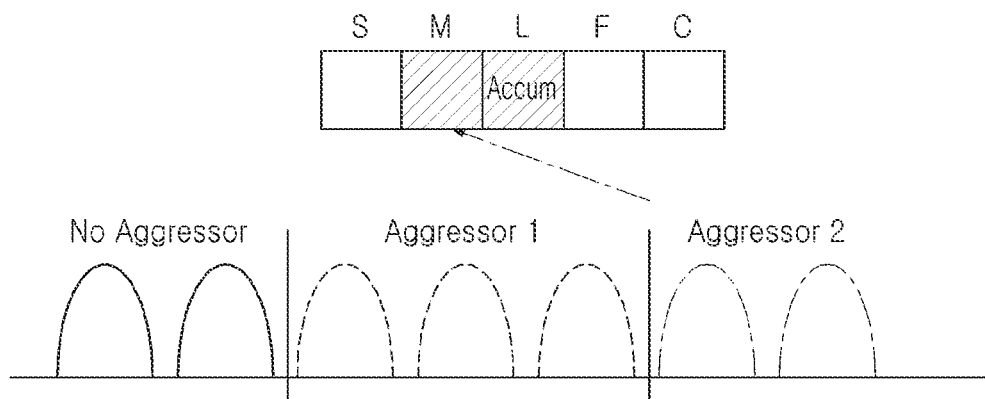
FIGS. 7A through 7E are diagrams illustrating a data recovery read operation, in which two aggressor groups are applied, in a non-volatile memory device according to an exemplary embodiment of the present disclosure.

As illustrated in FIG. 7A, a result value may be stored in the first latch M, the result value being sensed using a read level (that is, a read level between a first aggressor group and a second aggressor group) for identifying information of the second aggressor group connected to an adjacent word line. That is, the information of the second aggressor group connected to the adjacent word line may be stored in the first latch M. At the same time, the data stored in the first latch M may be updated in the second latch L.

Figure 7B:
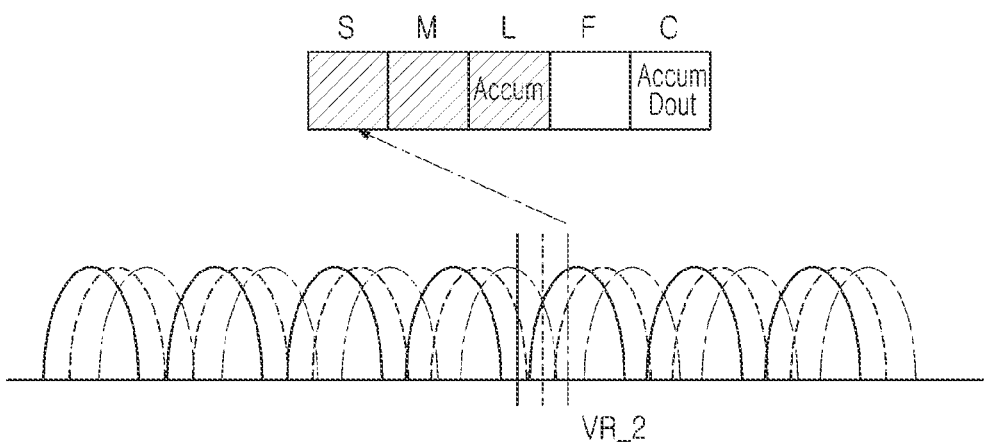

Thereafter, as illustrated in FIG. 7B, data of a memory cell connected to a selected word line may be read using a read level VR_2 (first read level) for the second aggressor group, and the read data may be stored in the third latch S. Read data corresponding to the second aggressor group may be updated in the fourth latch C using the data stored in the third latch S and the data stored in the first latch M.

Figure 7C:
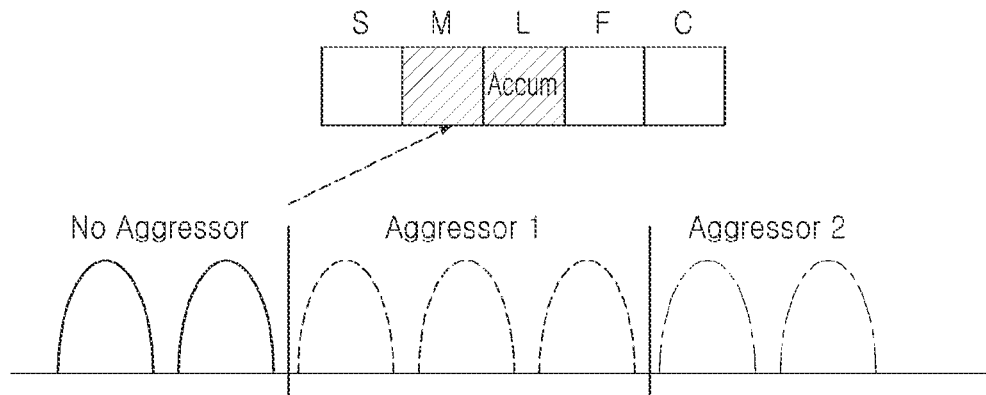

Thereafter, as illustrated in FIG. 7C, a result value may be stored in the first latch M, the result value being sensed using a read level (that is, a read level between a no aggressor group and the first aggressor group) for identifying information of the first aggressor group connected to the adjacent word line. That is, the information of the first aggressor group connected to the adjacent word line may be stored in the first latch M. The data stored in the first latch M may be changed using the data updated in the second latch L. That is, the information of the second aggressor group may be deleted from the first latch M. Then, data of the second aggressor group may be updated in the second latch L.

Figure 7D:
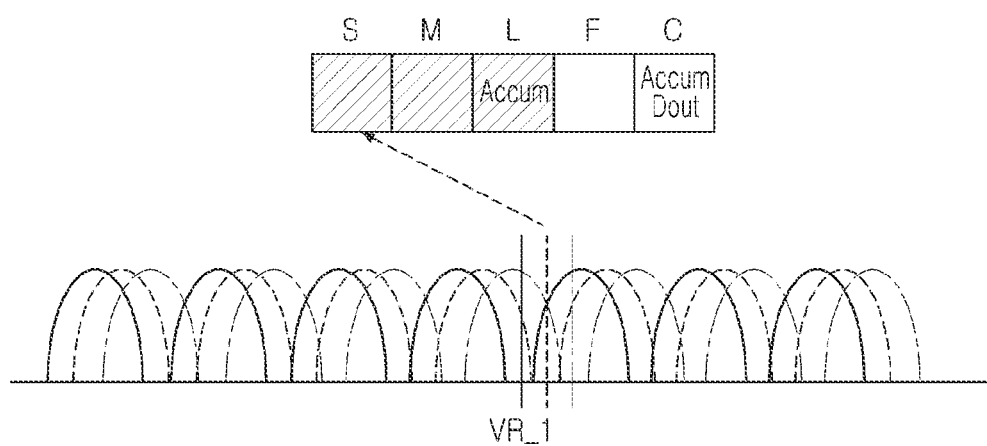

Thereafter, as illustrated in FIG. 7D, data of the memory cell connected to the selected word line may be read using a read level VR_1 for the first aggressor group, and the read data may be stored in the third latch S. Read data corresponding to the first aggressor group may be updated in the fourth latch C using the data stored in the third latch S and the data stored in the first latch M.

Figure 7E:
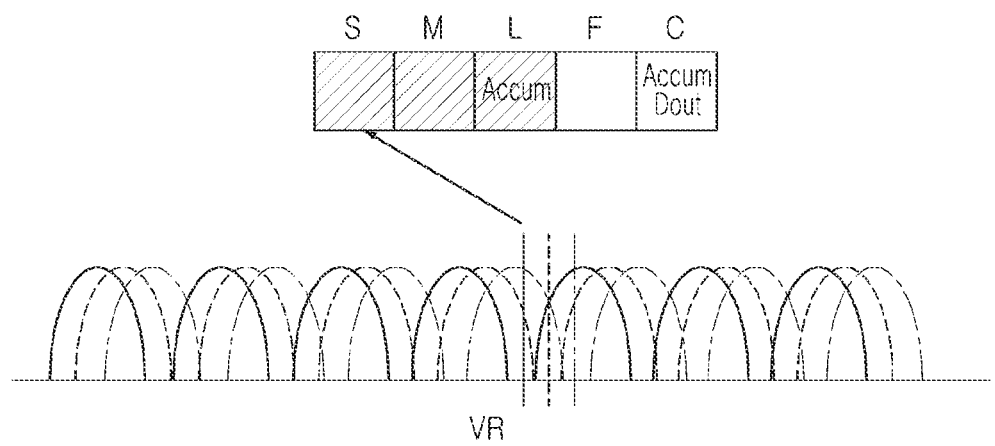

Thereafter, as illustrated in FIG. 7E, data of the memory cell connected to the selected word line may be read using the read level VR, and the read data may be stored in the third latch S.

The non-volatile memory device 100 according to an exemplary embodiment of the present disclosure may perform the data recovery read operation, in which two aggressor groups are applied, using four latches S, M, L, and C.

Figure 8:
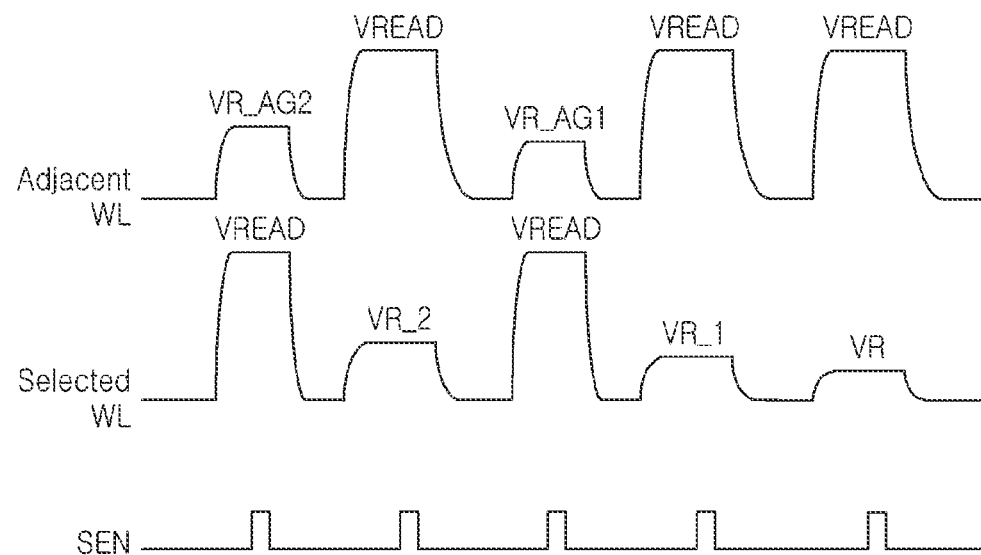
FIG. 8 is a diagram illustrating timings for the data recovery read operation using two aggressor groups in a non-volatile memory device according to an exemplary embodiment of the present disclosure.

FIG. 8 is a diagram illustrating timings for the data recovery read operation using two aggressor groups in the non-volatile memory device 100 according to an exemplary embodiment of the present disclosure.

Referring to FIG. 8, a sensing operation may be performed on a memory cell connected to an (n−1)th word line WLn−1 (an adjacent word line WL) using an aggressor group read level VR_AG2 to obtain information of a second aggressor group, and then a sensing operation may be performed on a memory cell connected to an n-th word line (a selected word line WL) using a read level VR_2 for the second aggressor group.

Thereafter, a sensing operation in response to a sensing activation signal SEN may be performed on the memory cell connected to the (n−1)th word line WLn−1 using an aggressor group read level VR_AG1 to obtain information of a first aggressor group, and then a sensing operation may be performed on the memory cell connected to the n-th word line using a read level VR_1 for the first aggressor group.

Then, a sensing operation may be performed on a memory cell connected to the n-th word line using the read level VR.

In FIG. 8, when performing the data recovery read operation, aggressor group information is obtained as the level is decreased from a high level to a low level. However, it should be understood that exemplary embodiments of the present disclosure are not limited thereto. For example, according to exemplary embodiments, the aggressor group information may also be obtained as the level is increased from a low level to a high level.

Figure 9:
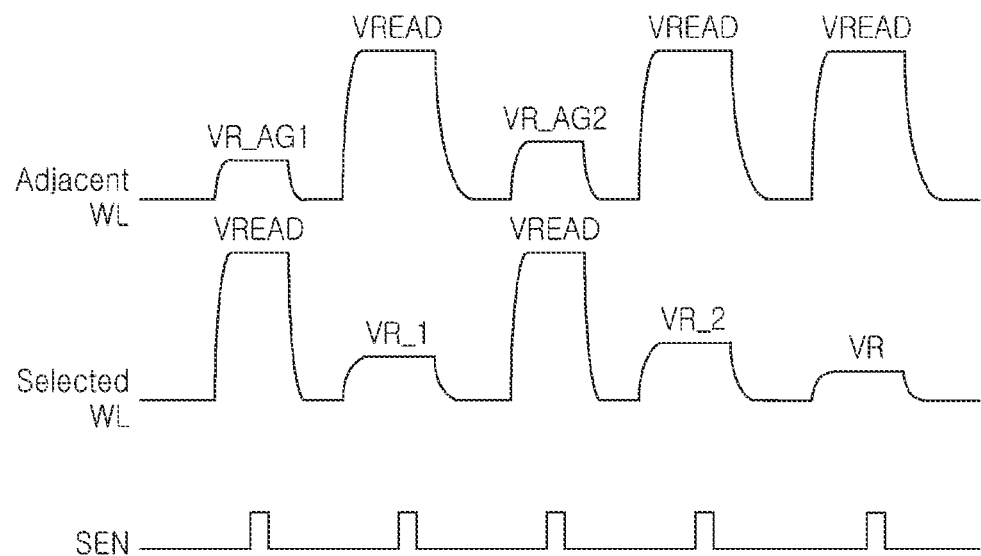
FIG. 9 is a diagram illustrating timings for the data recovery read operation using two aggressor groups in a non-volatile memory device according to an exemplary embodiment of the present disclosure.

FIG. 9 is a diagram illustrating timings for the data recovery read operation using two aggressor groups in the non-volatile memory device 100 according to an exemplary embodiment of the present disclosure.

Referring to FIG. 9, the aggressor group information may be obtained as the level is increased from a lower level (VR_AG1) to a high level (VR_AG2) in the data recovery read operation, unlike that illustrated in FIG. 8.

In a read operation for the selected word line, an on-chip valley search (OVS) sensing operation may be performed.

Figure 10:
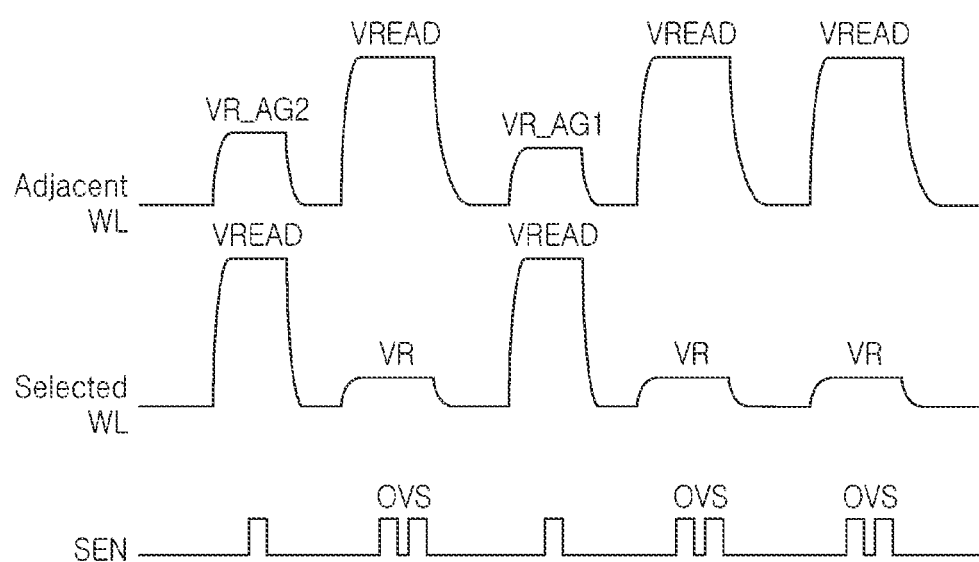
FIG. 10 is a diagram illustrating timings for a data recovery read operation using two aggressor groups in the non-volatile memory device according to another exemplary embodiment of the present disclosure.

FIG. 10 is a diagram illustrating timings for the data recovery read operation using two aggressor groups in the non-volatile memory device 100 according to an exemplary embodiment of the present disclosure.

Referring to FIG. 10, the data recovery read operation may be performed by performing the OVS sensing operation for a memory cell connected to a selected word line, unlike that illustrated in FIG. 8. The OVS sensing operation may include sensing operations corresponding to a plurality of develop times at the same level VR. Therefore, a plurality of latch operations for sensing data may be performed.

Although FIGS. 7A through 10 illustrate the data recovery read operations in which two aggressor groups are applied, the number of aggressor groups according to exemplary embodiments of the present disclosure are not limited thereto.

FIGS. 11A through 11G are diagrams illustrating a data recovery read operation, in which three aggressor groups are applied, in the non-volatile memory device 100 according to an exemplary embodiment of the present disclosure.

Figure 11A:
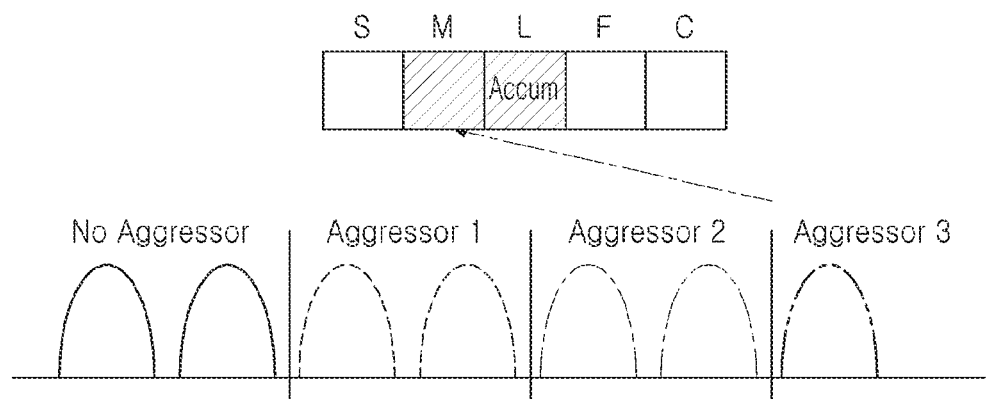
FIGS. 11A through 11G are diagrams illustrating a data recovery read operation, in which three aggressor groups are applied, in a non-volatile memory device according to an exemplary embodiment of the present disclosure.

As illustrated in FIG. 11A, a result value may be stored in the first latch M, the result value being sensed using a read level (that is, a read level between a second aggressor group and a third aggressor group) for identifying information of the third aggressor group connected to an adjacent word line. That is, the information of the third aggressor group connected to the adjacent word line may be stored in the first latch M. At the same time, the data stored in the first latch M may be updated in the second latch L.

Figure 11B:
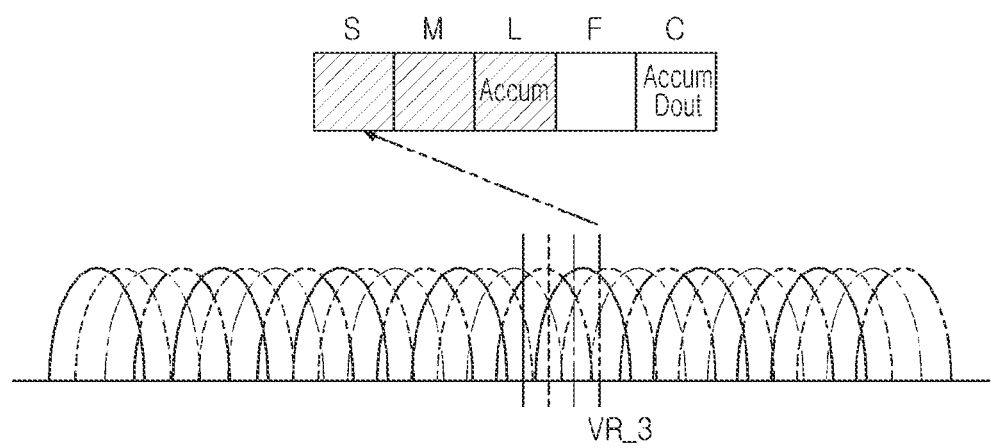

Thereafter, as illustrated in FIG. 11B, data of a memory cell connected to a selected word line may be read using a read level VR_3 for the third aggressor group, and the read data may be stored in the third latch S. Read data corresponding to the third aggressor group may be updated in the fourth latch C using the data stored in the third latch S and the data stored in the first latch M.

Figure 11C:
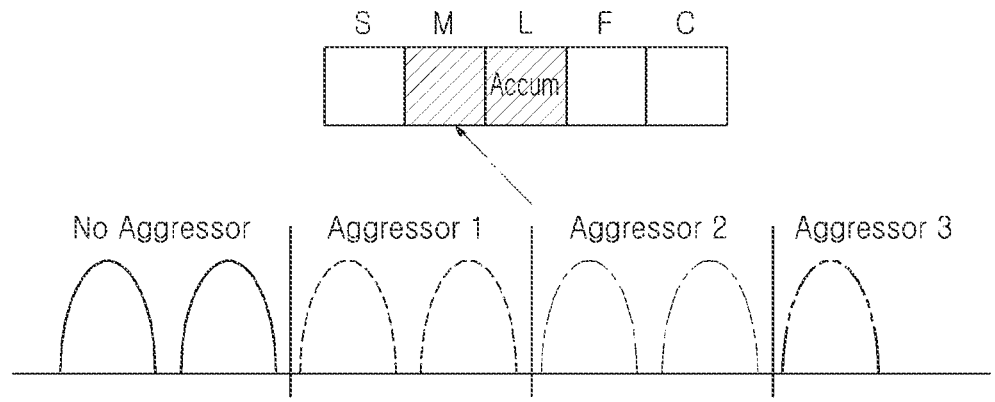

Thereafter, as illustrated in FIG. 11C, a result value may be stored in the first latch M, the result value being sensed using a read level (that is, a read level between a first aggressor group and the second aggressor group) for identifying information of the second aggressor group connected to the adjacent word line. That is, the information of the second aggressor group connected to the adjacent word line may be stored in the first latch M. The data stored in the first latch M may be changed using the data updated in the second latch L. That is, the information of the third aggressor group may be deleted from the first latch M. Then, data of the first and second aggressor groups may be updated in the second latch L.

Figure 11D:
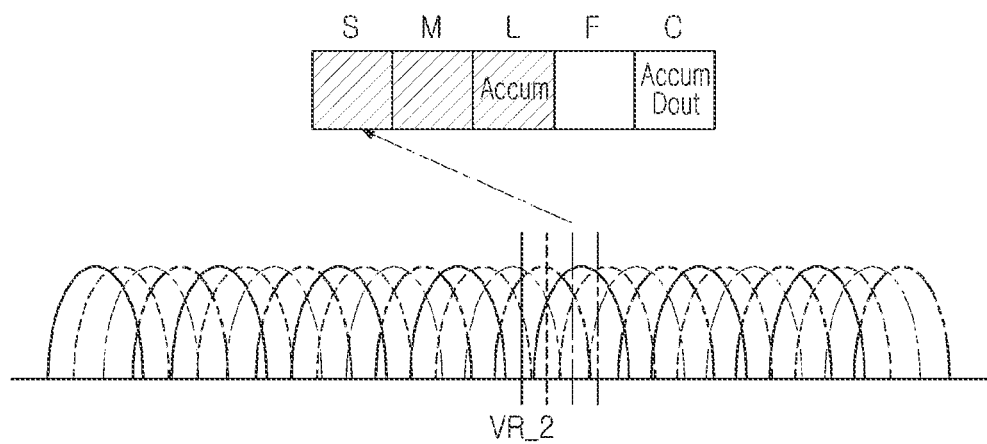

Thereafter, as illustrated in FIG. 11D, data of the memory cell connected to the selected word line may be read using a read level VR_2 for the second aggressor group, and the read data may be stored in the third latch S. Read data corresponding to the second aggressor group may be updated in the fourth latch C using the data stored in the third latch S and the data stored in the first latch M.

Figure 11E:
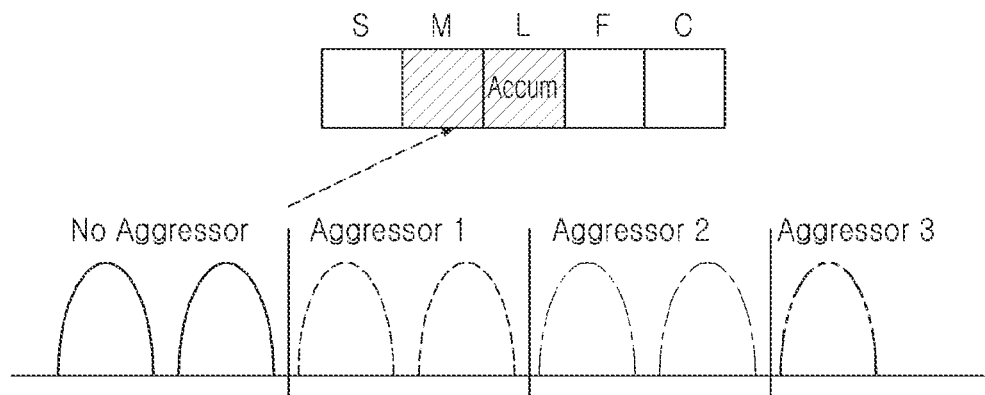
Figure 11F:
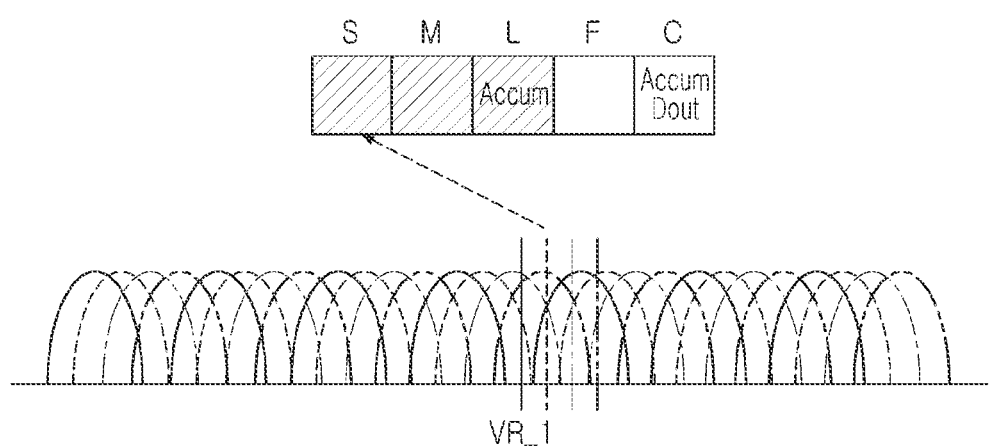

Thereafter, as illustrated in FIG. 11E, a result value may be stored in the first latch M, the result value being sensed using a read level (that is, a read level between a no aggressor group and the first aggressor group) for identifying information of the first aggressor group connected to the adjacent word line. That is, the information of the first aggressor group connected to the adjacent word line may be stored in the first latch M. A value sensed using the read level between the first aggressor group and the second aggressor group may be accumulated in the second latch L, and a value sensed using the read level between the no aggressor group and the first aggressor group may be updated in the first latch M. Thereafter, as illustrated in FIG. 11F, data of the memory cell connected to the selected word line may be read using a read level VR_1 for the first aggressor group, and the read data may be stored in the third latch S. Read data corresponding to the first aggressor group may be updated in the fourth latch C using the data stored in the third latch S and the data stored in the first latch M.

Figure 11G:
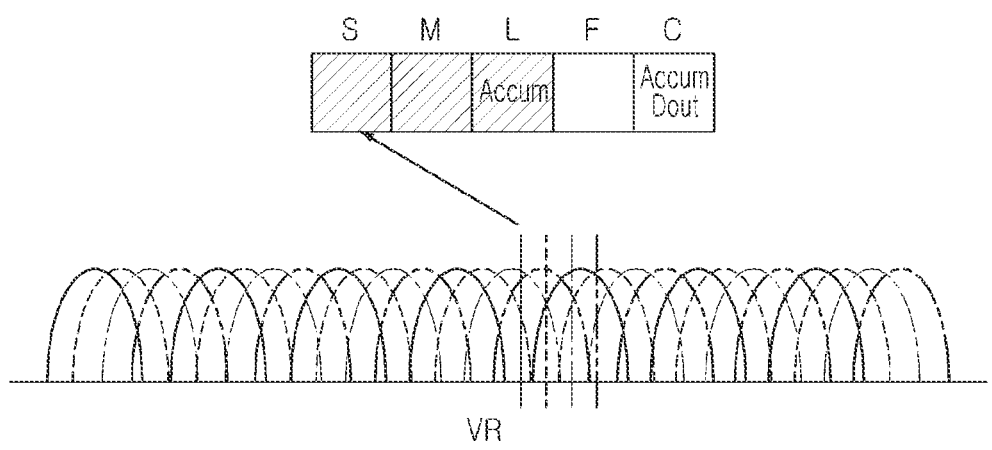

Thereafter, as illustrated in FIG. 11G, data of the memory cell connected to the selected word line may be read using the read level VR, and the read data may be stored in the third latch S.

According to exemplary embodiments of the present disclosure, aggressor group allocation may vary.

Figure 12A:
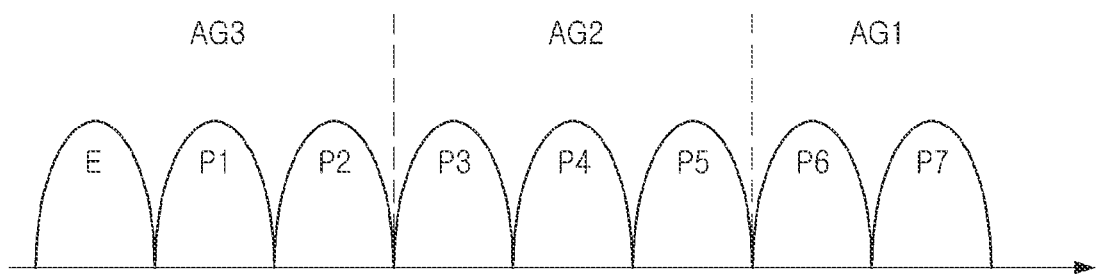
FIGS. 12A through 12C are views illustrating aggressor group allocation according to an exemplary embodiment of the present disclosure.
Figure 12B:
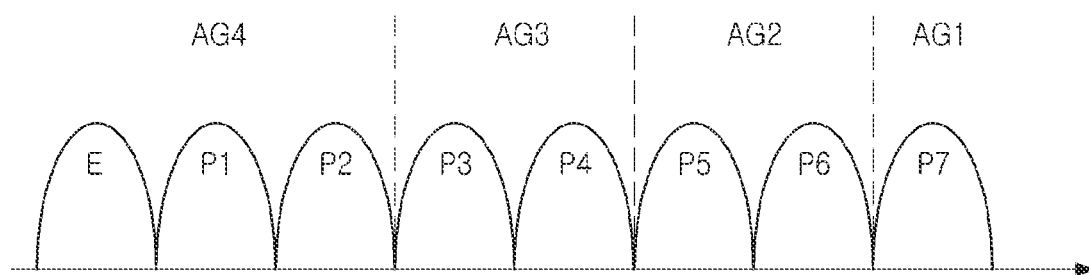
Figure 12C:
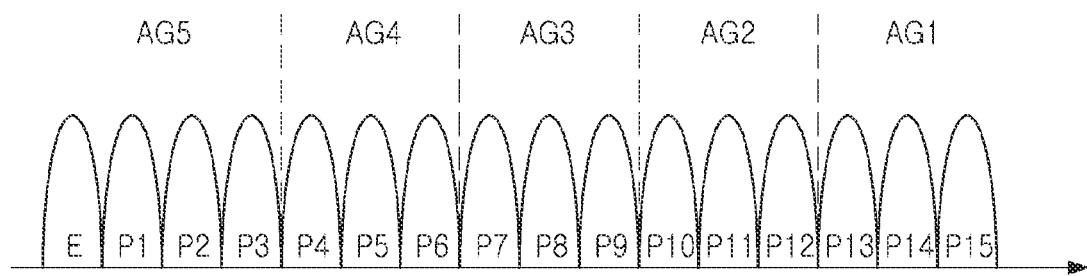

FIGS. 12A through 12C are views illustrating aggressor group allocation according to an exemplary embodiment of the present disclosure.

FIG. 12A is a diagram illustrating aggressor groups for a 3-bit memory cell according to an exemplary embodiment of the present disclosure.

Referring to FIG. 12A, a first aggressor group AG1 may include a memory cell programmed to one of a sixth programming status P6 and a seventh programming status P7. A second aggressor group AG2 may include a memory cell programmed to one of a third programming status P3, a fourth programming status P4, and a fifth programming status P5. A third aggressor group AG3 may include a memory cell programmed to one of an erase status E, a first programming status P1, and a second programming status P2.

It should be understood that the relationship between the programming statuses and the aggressor groups illustrated in FIG. 12A is only an example. According to exemplary embodiments of the present disclosure, the relationship between the programming statuses and the aggressor groups may vary.

FIG. 12B is a diagram illustrating aggressor groups for a 3-bit memory cell according to an exemplary embodiment of the present disclosure.

Referring to FIG. 12B, a first aggressor group AG1 may include a memory cell programmed to a seventh programming status P7. A second aggressor group AG2 may include a memory cell programmed to one of a fifth programming status P5 and a sixth programming status P6. A third aggressor group AG3 may include a memory cell programmed to one of a third programming status P3 and a fourth programming status P4. A fourth aggressor group AG4 may include a memory cell programmed to one of an erase status E, a first programming status P1, and a second programming status P2.

Although FIGS. 12A and 12B illustrate aggressor groups for a 3-bit memory cell, it should be understood that the memory cell according to exemplary embodiments of the present disclosure are not limited to a 3-bit memory cell.

FIG. 12C is a diagram illustrating aggressor groups for a 4-bit memory cell according to an exemplary embodiment of the present disclosure.

Referring to FIG. 12C, a first aggressor group AG1 may include a memory cell programmed to one of a thirteenth programming status P13, a fourteenth programming status P14, and a fifteenth programming status P15. A second aggressor group AG2 may include a memory cell programmed to one of a tenth programming status P10, an eleventh programming status P11, and a twelfth programming status P12. A third aggressor group AG3 may include a memory cell programmed to one of a seventh programming status P7, an eighth programming status P8, and a ninth programming status P9. A fourth aggressor group AG4 may include a memory cell programmed to one of a fourth programming status P4, a fifth programming status P5, and a sixth programming status P6. A fifth aggressor group AG5 may include a memory cell programmed to one of an erase status E, a first programming status P1, a second programming status P2, and a third programming status P3.

Figure 13:
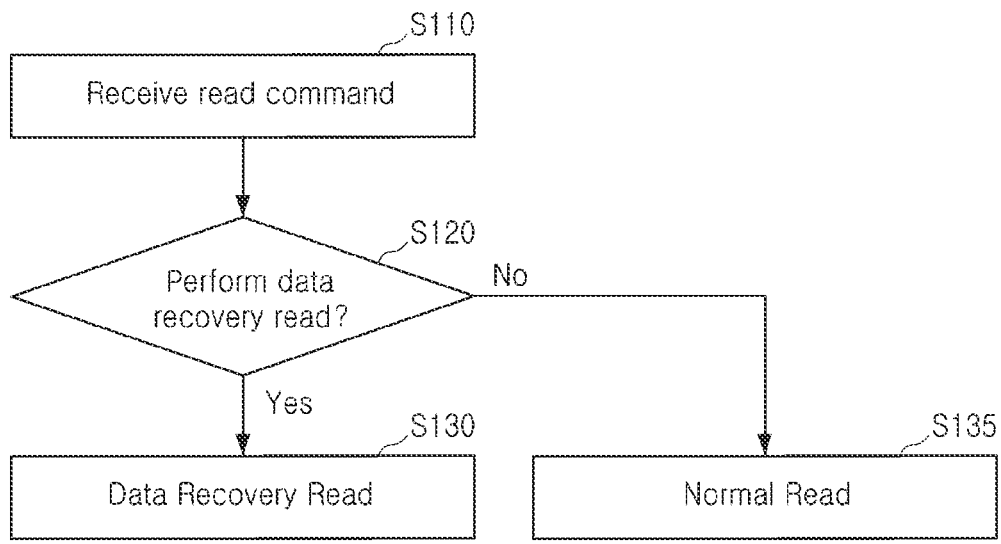
FIG. 13 is a flowchart illustrating a read method of a non-volatile memory device according to an exemplary embodiment of the present disclosure.

FIG. 13 is a flowchart illustrating a read method of the non-volatile memory device 100 according to an exemplary embodiment of the present disclosure.

Referring to FIG. 13, in the read method, a read command may be received (S110), and it may be determined whether to perform the data recovery read operation in response to the read command (S120). In a case in which the data recovery read operation is to be performed, the data recovery read operation may be performed as described with reference to FIGS. 1 through 12 (S130). On the other hand, in a case in which the data recovery read operation is not to be performed, a normal read operation may be performed (S135).

Figure 14:
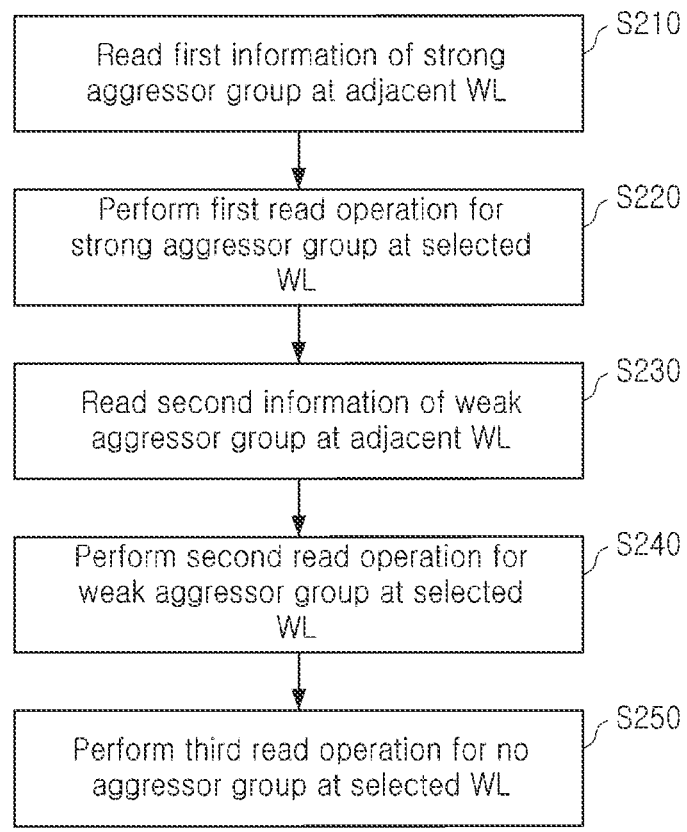
FIG. 14 is a flowchart illustrating a data recovery read method of a non-volatile memory device according to an exemplary embodiment of the present disclosure.

FIG. 14 is a flowchart illustrating a data recovery read method of the non-volatile memory device 100 according to an exemplary embodiment of the present disclosure.

Referring to FIGS. 1 through 14, the data recovery read method may be performed as follows.

First information of a strong aggressor group connected to an adjacent word line may be read (S210). A first read operation for the strong aggressor group may be performed on a memory cell connected to a selected word line using the first information (S220). Second information of a weak aggressor group connected to the adjacent word line may be read (S230). A second read operation for the weak aggressor group may be performed on the memory cell connected to the selected word line using the second information (S240). Then, a third read operation may be performed on the memory cell connected to the selected word line (S250).

Figure 15:
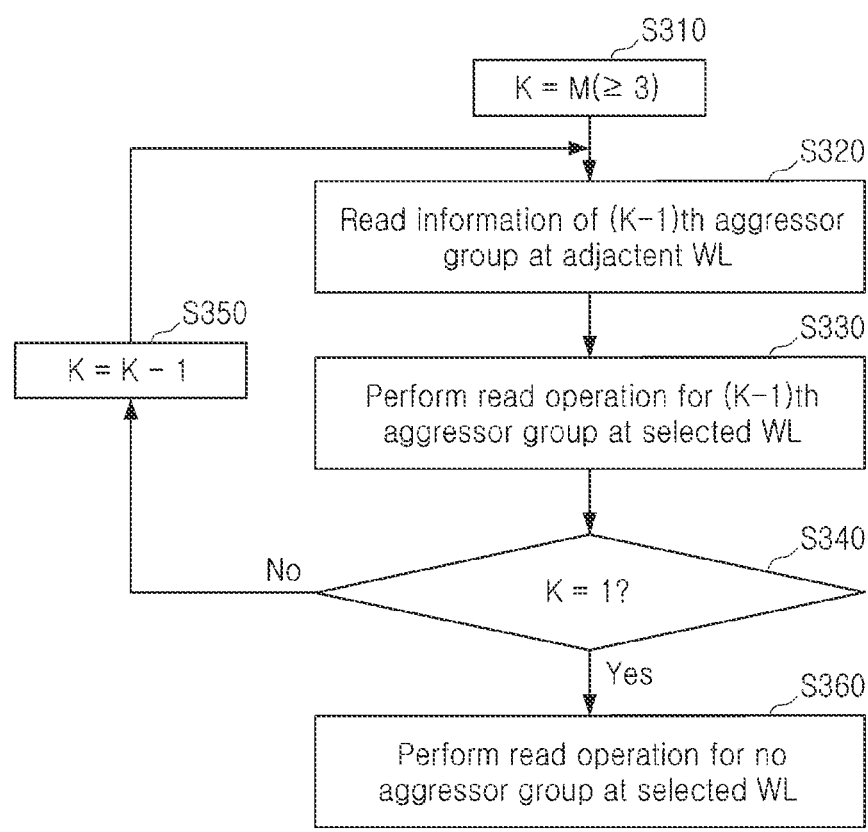
FIG. 15 is a flowchart illustrating a data recovery read method of a non-volatile memory device according to an exemplary embodiment of the present disclosure.

FIG. 15 is a flowchart illustrating a data recovery read method of the non-volatile memory device 100 according to an exemplary embodiment of the present disclosure.

Referring to FIGS. 1 through 15, the data recovery read method may be performed as follows.

In an initial operation, K may be set to M (the number of aggressor groups, M being an integer of 3 or more) (S310). Information of a (K−1)th aggressor group connected to an adjacent word line may be read. The read data may be stored in the latch M. Update data may be stored in the latch L (S320). Then, a read operation for the (K−1)th aggressor group may be performed on a memory cell connected to a selected word line (S330). The read data may be stored in the latch S. Read data corresponding to the current aggressor group may be updated in the cache latch C using the data stored in the latch S and data of the current aggressor group stored in the latch M. Next, it may be determined whether K is 1 (S340). In a case in which K is not 1, 1 may be subtracted from K (S350), and then, operation S320 may be performed. On the other hand, in a case in which K is 1, a read operation for a no aggressor group may be performed on the memory cell connected to the selected word line (S360).

The adjacent word line according to an exemplary embodiment of the present disclosure may be a higher word line or lower word line of the selected word line.

Figure 16:
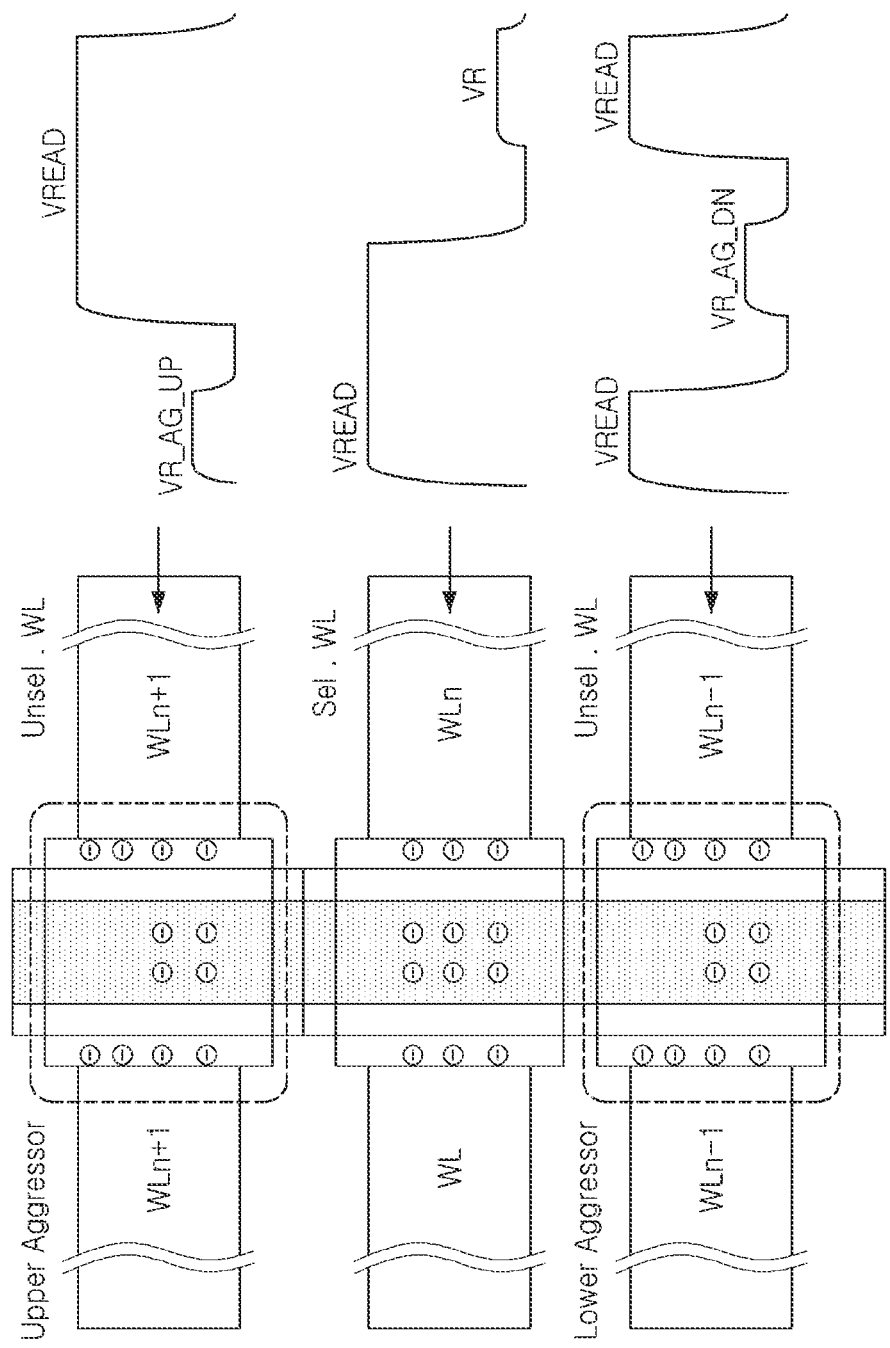
FIG. 16 is a diagram illustrating a concept of a data recovery read operation reflecting an upper aggressor and a lower aggressor of a memory cell according to an exemplary embodiment of the present disclosure.

FIG. 16 is a diagram illustrating a concept of a data recovery read operation reflecting an upper aggressor and a lower aggressor of a memory cell according to an exemplary embodiment of the present disclosure.

Referring to FIG. 16, upper aggressor information and lower aggressor information may be obtained, and then a read operation for a selected word line may be performed on the basis of such information. The upper aggressor information may be obtained by a sensing operation using a first level VR_AG_UP. The lower aggressor information may be obtained by a sensing operation using a second level VR_AG_DN. A corresponding recovery read operation may be performed by reflecting the upper/lower aggressor information.

Figure 17:
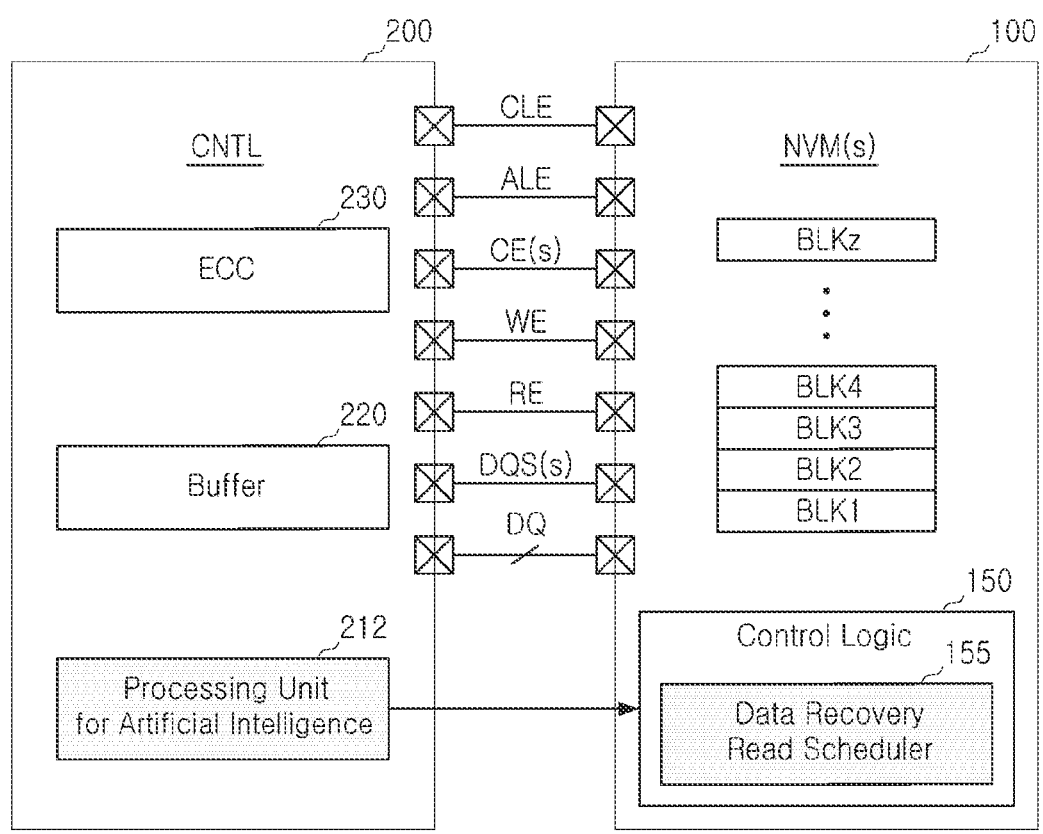
FIG. 17 is a diagram illustrating a storage device according to an exemplary embodiment of the present disclosure.

FIG. 17 is a diagram illustrating a storage device 10 according to an exemplary embodiment of the present disclosure.

Referring to FIG. 17, the storage device 10 may include at least one non-volatile memory device 100 and a controller 200. As illustrated in FIG. 17, the non-volatile memory device 100 may include a user data area and a metadata area. The user data area may store user data and may be implemented by the plurality of memory blocks described with reference to FIGS. 1 through 3. The metadata area may store management information for managing the non-volatile memory device 100, and may be implemented by at least one memory block described with reference to FIGS. 2A and 2B. According to exemplary embodiments, the metadata area may be implemented by a different memory block than that of the user data area. A memory cell corresponding to the user data area may store multi-bit data, and a memory cell corresponding to the metadata area may store single-bit data.

The controller 200 may be connected to at least one non-volatile memory device 100 through a plurality of channels. The controller 200 may include a processor, a processing unit 212 for artificial intelligence, a buffer memory 220, and an error correction circuit 230.

The controller 200 may further include a timer implemented in the form of hardware, software, or firmware. The timer may receive information regarding a time from outside of the controller 200, and generate/output a current time. For example, the timer may receive a system clock, and generate a current time by counting the system clock. In an example, the timer may receive time information from outside of the controller 200, and generate a current time by counting an internal clock. The internal clock may be generated by an oscillator in the storage device 10.

At least one processor may be implemented to control an overall operation of the storage device 10. The processor may perform various management operations such as, for example, cache/buffer management, firmware management, garbage collection management, wear leveling management, data de-duplication management, read refresh/reclaim management, bad block management, multi-stream management, management of mapping of host data and a non-volatile memory, quality of service (QoS) management, system resource allocation management, non-volatile memory queue management, read voltage level management, erase/program management, hot/cold data management, power loss protection management, dynamic heat management, initialization management, and management of a redundant array of inexpensive disks (RAID).

In an exemplary embodiment, the processing unit 212 for artificial intelligence may be implemented to increase data reliability of the non-volatile memory device 100. For example, the processing unit 212 may determine whether the data recovery read operation for a plurality of aggressor groups is to be performed and request the non-volatile memory device 100 to perform the data recovery read operation as described with reference to FIGS. 1 through 16.

Figure 18:
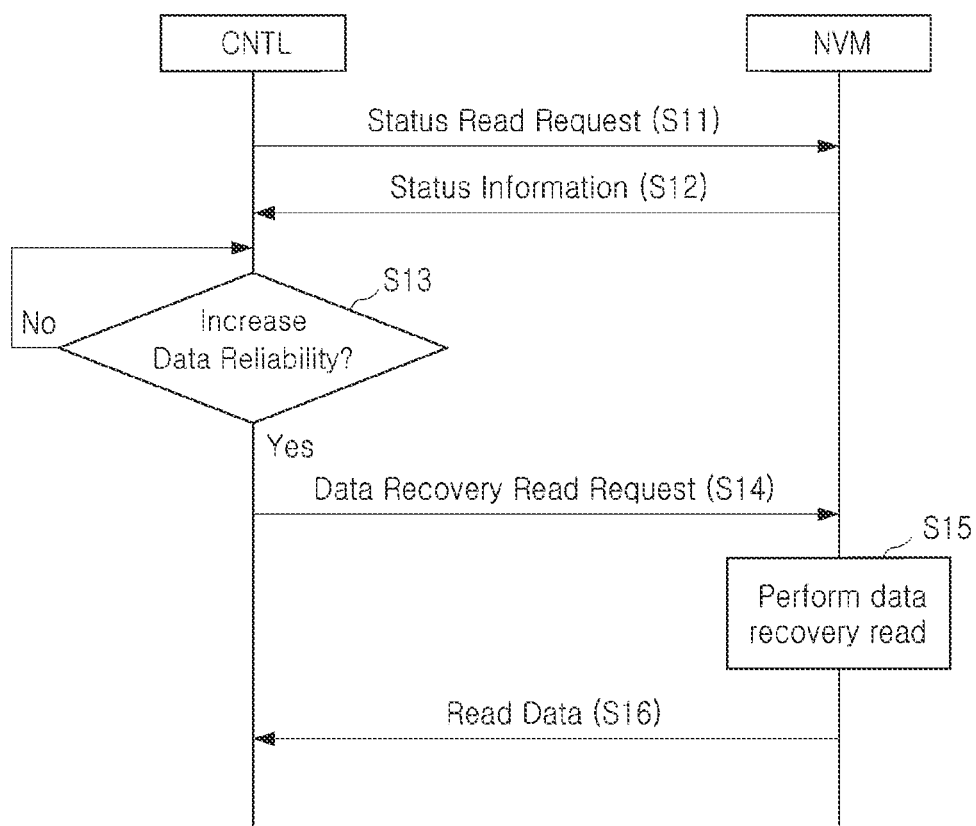
FIG. 18 is a ladder diagram illustrating an operation of a storage device according to an exemplary embodiment of the present disclosure.

FIG. 18 is a ladder diagram illustrating an operation of the storage device 10 according to an exemplary embodiment of the present disclosure.

Referring to FIG. 18, the storage device 10 may perform the following operation, which may increase reliability.

The controller (CNTL) 200 may transmit a status read request to the non-volatile memory device (NVM) 100 (S11). The non-volatile memory device 100 may generate status information and transmit, to the controller 200, the generated status information in response to the status read request (S12). The controller 200 may determine whether data reliability can be improved on the basis of the status information (S13). In a case in which it is determined that data reliability can be increased, the controller 200 may transmit, to the non-volatile memory device 100, a data recovery read request (S14). The non-volatile memory device 100 may perform the data recovery read operation described with reference to FIGS. 1 through 16 in response to the data recovery read request (S15). The non-volatile memory device 100 may transmit, to the controller 200, data read by performing the data recovery read operation (S16). The controller 200 may program the transmitted data in a new block.

The non-volatile memory device according to an exemplary embodiment of the present disclosure may be implemented in a chip-to-chip (C2C) structure.

Figure 19:
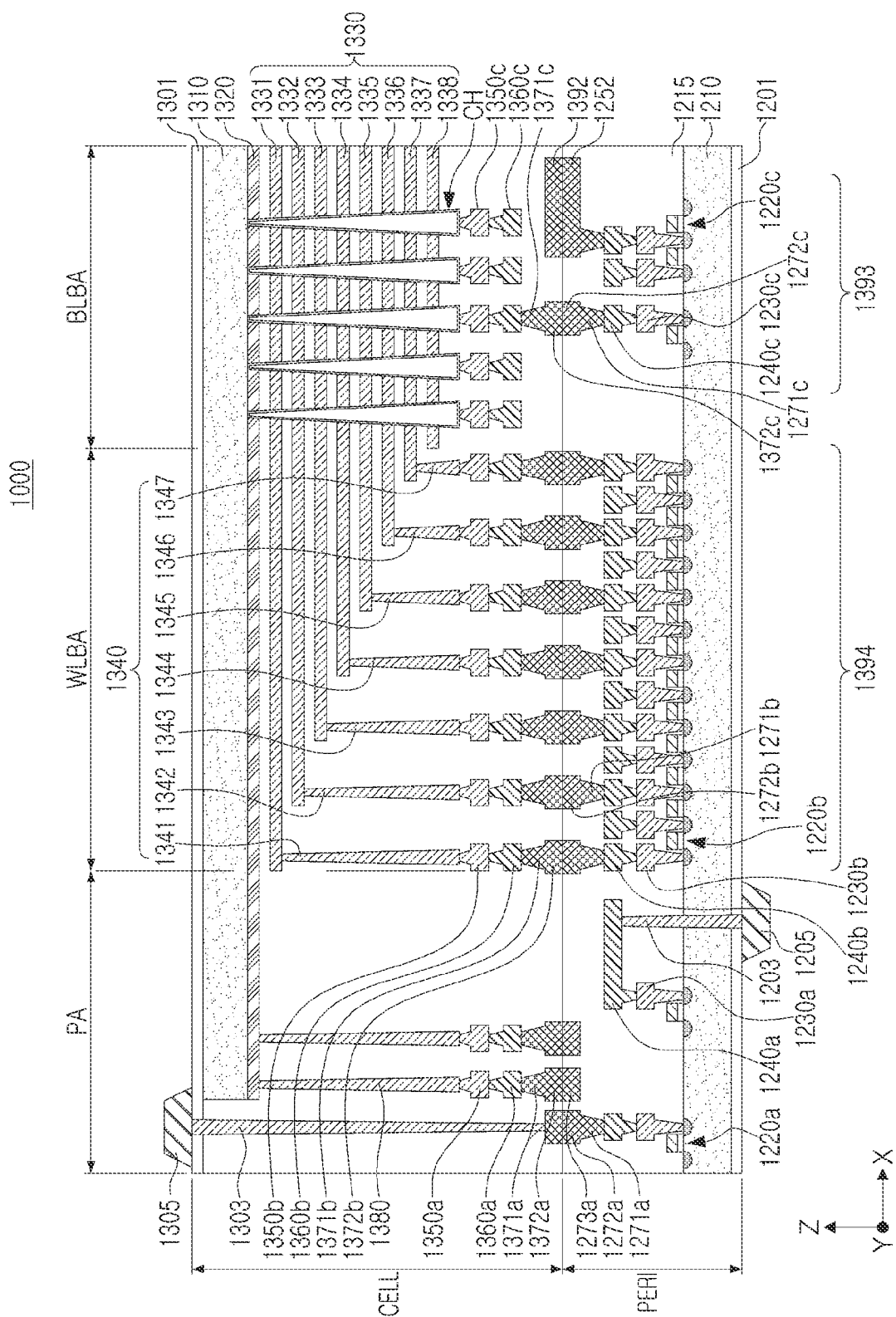
FIG. 19 is a diagram illustrating a non-volatile memory device implemented in a chip-to-chip (C2C) structure according to an exemplary embodiment of the present disclosure.

FIG. 19 is a diagram illustrating a non-volatile memory device 1000 implemented in the C2C structure according to an exemplary embodiment of the present disclosure.

Referring to FIG. 19, the C2C structure may refer to a structure in which an upper chip including a cell area CELL is formed on a first wafer, a lower chip including a peripheral circuit area PERI is formed on a second wafer different from the first wafer, and the upper chip and the lower chip are connected to each other by a bonding method. For example, the bonding method may be a method in which a bonding metal formed in the uppermost metal layer of the upper chip and a bonding metal formed in the uppermost metal layer of the lower chip are electrically connected to each other. In an example, in a case in which the bonding metal is formed of copper (Cu), the bonding method may be a Cu-to-Cu bonding method. In an example, the bonding metal may be formed of aluminum (Al) or tungsten (W).

Each of the peripheral circuit area PERI and the cell area CELL of the non-volatile memory device 1000 may include an external pad bonding area PA, a word line bonding area WLBA, and a bit line bonding area BLBA.

The peripheral circuit area PERI may include a first substrate 1210, an interlayer insulating layer 1215, a plurality of circuit elements 1220*a* to 1220*c* formed on the first substrate 1210, first metal layers 1230*a* to 1230*c* connected to the plurality of circuit elements 1220*a* to 1220*c*, respectively, and second metal layers 1240*a* to 1240*c* formed on the first metal layers 1230*a* to 1230*c*, respectively. In an example, the first metal layers 1230*a* to 1230*c* may be formed of tungsten having a relatively high specific resistance. In an example, the second metal layers 1240*a* to 1240*c* may be formed of copper having a relatively low specific resistance.

Although FIG. 19 illustrates the first metal layers 1230*a* to 1230*c* and the second metal layers 1240*a* to 1240*c*, exemplary embodiments of the present disclosure are not limited thereto. For example, according to exemplary embodiments, one or more metal layers may be further formed on the second metal layers 1240*a* to 1240*c*. At least some of one or more metal layers formed on the second metal layers 1240*a* to 1240*c* may be formed of aluminum or the like having a specific resistance different from that of copper used to form the second metal layers 1240*a* to 1240*c*.

In an example, the interlayer insulating layer 1215 may be disposed on the first substrate 1210 so as to cover the plurality of circuit elements 1220*a* to 1220*c*, the first metal layers 1230*a* to 1230*c*, and the second metal layers 1240*a* to 1240*c*. In an example, the interlayer insulating layer 1215 may be formed of an insulating material such as, for example, silicon oxide or silicon nitride.

Lower bonding metals 1271*b* and 1272*b* may be formed on the second metal layer 1240*b* of the word line bonding area WLBA. The lower bonding metals 1271*b* and 1272*b* of the peripheral circuit area PERI may be electrically connected to upper bonding metals 1371*b* and 1372*b* of the cell area CELL in the word line bonding area WLBA. In an example, the lower bonding metals 1271*b* and 1272*b* and the upper bonding metals 1371*b* and 1372*b* may be formed of, for example, aluminum, copper, tungsten, or the like. The upper bonding metals 1371*b* and 1372*b* of the cell area CELL may be referred to as first metal pads, and the lower bonding metals 1271*b* and 1272*b* may be referred to as second metal pads.

The cell area CELL may include at least one memory block. In an example, the cell area CELL may include a second substrate 1310 and a common source line 1320. A plurality of word lines 1331 to 1338, collectively, 1330, may be stacked on the second substrate 1310 in a direction (Z-axis direction) perpendicular to an upper surface of the second substrate 1310. In an example, string select lines and a ground select line may be disposed on an upper side and a lower side of the word lines 1330, respectively. In an example, the plurality of word lines 1330 may be disposed between the string select lines and the ground select line.

In the bit line bonding area BLBA, a channel structure CH may extend in the direction (Z-axis direction) perpendicular to the upper surface of the second substrate 1310, and penetrate through the word lines 1330, the string select lines, and the ground select line. The channel structure CH may include, for example, a data storage layer, a channel layer, an embedded insulating layer, and the like, and the channel layer may be electrically connected to a first metal layer 1350*c* and a second metal layer 1360*c*. For example, the first metal layer 1350*c* may be a bit line contact, and the second metal layer 1360*c* may be a bit line. In an example, the bit line 1360*c* may extend along a first direction (Y-axis direction) parallel to the upper surface of the second substrate 1310.

As illustrated in FIG. 19, an area in which the channel structure CH, the bit line 1360*c*, and the like are disposed may be defined as the bit line bonding area BLBA. In an example, in the bit line bonding area BLBA, the bit line 1360*c* may be electrically connected to the circuit elements 1220*c* that provide a page buffer 1393 in the peripheral circuit area PERI. For example, the bit line 1360*c* may be connected to the upper bonding metals 1371*c* and 1372*c* in the peripheral circuit area PERI. The upper bonding metals 1371*c* and 1372*c* may be connected to the lower bonding metals 1271*c* and 1272*c* connected to the circuit elements 1220*c* of the page buffer 1393. In the word line bonding area WLBA, the word lines 1330 may extend along a second direction (X-axis direction) perpendicular to the first direction and parallel to the upper surface of the second substrate 1310. In an example, the word line bonding area WLBA may be connected to a plurality of cell contact plugs 1341 to 1347, collectively, 1340. For example, the word lines 1330 and the cell contact plugs 1340 may be connected to each other at pads that are provided as at least some of the word lines 1330 extend at different lengths along the second direction. In an example, a first metal layer 1350*b* and a second metal layer 1360*b* may be sequentially connected to an upper portion of each of the cell contact plugs 1340 connected to the word lines 1330. In an example, the cell contact plugs 1340 may be connected to the peripheral circuit area PERI through the upper bonding metals 1371*b* and 1372*b* of the cell area CELL and the lower bonding metals 1271*b* and 1272*b* of the peripheral circuit area PERI, in the word line bonding area WLBA.

In an example, the cell contact plugs 1340 may be electrically connected to the circuit elements 1220*b* that provide a row decoder 1394 in the peripheral circuit area PERI. In an example, an operating voltage of the circuit elements 1220b that provide the row decoder 1394 may be different from an operating voltage of the circuit elements 1220c that provide the page buffer 1393. For example, the operating voltage of the circuit elements 1220c that provide the page buffer 1393 may be higher than the operating voltage of the circuit elements 1220b that provide the row decoder 1394.

A common source line contact plug 1380 may be disposed in the external pad bonding area PA. In an example, the common source line contact plug 1380 may be formed of a conductive material such as a metal, a metal compound, or polysilicon. The common source line contact plug 1380 may be electrically connected to the common source line 1320. The first metal layer 1350a and the second metal layer 1360a may be sequentially stacked on the common source line contact plug 1380. For example, an area in which the common source line contact plug 1380, the first metal layer 1350a, and the second metal layer 1360a are disposed may be defined as the external pad bonding area PA. The second metal layer 1360a may be electrically connected to an upper metal via 1371a. The upper metal via 1371a may be electrically connected to an upper metal pattern 1372a.

Input/output pads 1205 and 1305 may be disposed in the external pad bonding area PA. Referring to FIG. 19, a lower insulation layer 1201 covering a lower surface of the first substrate 1210 may be formed on a lower side of the first substrate 1210. Further, the first input/output pad 1205 may be formed on the lower insulation layer 1201. In an example, the first input/output pad 1205 may be connected to at least one of the plurality of circuit elements 1220a to 1220c disposed in the peripheral circuit area PERI through a first input/output contact plug 1203. In an example, the first input/output pad 1205 may be separated from the first substrate 1210 by the lower insulation layer 1201. Further, side insulation layers may be disposed between the first input/output contact plug 1203 and the first substrate 1210, thereby electrically separating the first input/output contact plug 1203 and the first substrate 1210 from each other.

Referring to FIG. 19, an upper insulation layer 1301 covering the upper surface of the second substrate 1310 may be formed on an upper side of the second substrate 1310. Further, the second input/output pad 1305 may be formed on the upper insulation layer 1301. In an example, the second input/output pad 1305 may be connected to at least one of the plurality of circuit elements 1220a to 1220c disposed in the peripheral circuit area PERI through a second input/output contact plug 1303, a lower metal pattern 1272a, and a lower metal via 1271a.

In an example, the second substrate 1310, the common source line 1320, and the like may be disposed in a different area than the area in which the second input/output contact plug 1303 is disposed. Further, in an exemplary embodiment, the second input/output pad 1305 does not overlap the word lines 1330 in a third direction (Z-axis direction). Referring to FIG. 19, the second input/output contact plug 1303 may be separated from the second substrate 1310 in a direction parallel to the upper surface of the second substrate 1310. Further, the second input/output contact plug 1303 may penetrate through the interlayer insulating layer 1215 of the cell area CELL and be connected to the second input/output pad 1305. In an example, the second input/output pad 1305 may be electrically connected to the circuit element 1220a.

In an example, the first input/output pad 1205 and the second input/output pad 1305 may be selectively formed. For example, the non-volatile memory device 1000 may include only the first input/output pad 1205 disposed on the first substrate 1201, or only the second input/output pad 1305 disposed on the second substrate 1301. In an example, the non-volatile memory device 1000 may include both the first input/output pad 1205 and the second input/output pad 1305.

A metal pattern of the uppermost metal layer may exist as a dummy pattern in each of the external pad bonding area PA and the bit line bonding area BLBA included in each of the cell area CELL and the peripheral circuit area PERI, or the uppermost metal layer may be empty.

In the non-volatile memory device 1000 according to an exemplary embodiment of the present disclosure, in the external pad bonding area PA, a lower metal pattern 1273a having the same shape as that of the upper metal pattern 1372a of the cell area CELL may be formed in the uppermost metal layer of the peripheral circuit area PERI so as to correspond to the upper metal pattern 1372a formed in the uppermost metal layer of the cell area CELL. In an exemplary embodiment, the lower metal pattern 1273a formed in the uppermost metal layer of the peripheral circuit area PERI is not connected to a separate contact in the peripheral circuit area PERI. Similarly, the upper metal pattern 1392 having the same shape as that of the lower metal pattern 1252 of the peripheral circuit area PERI may be formed in the uppermost metal layer of the cell area CELL so as to correspond to the lower metal pattern 1252 formed in the uppermost metal layer of the peripheral circuit area PERI, in the external pad bonding area PA.

In the data recovery read method according to an exemplary embodiment of the present disclosure, the data recovery read operation may be performed, because an additional storage space is not required unlike a comparative example even when the number of aggressor groups is increased. The comparative example may use a method in which information of the aggressor groups is read in a lump and then stored in a latch. In this case, the number of required storage latches is increased proportionately with the increase of the number of aggressor groups. In contrast, in the data recovery read method according to exemplary embodiments of the present disclosure, information of one aggressor group may be divided and stored, and then only data of a corresponding aggressor group may be recovered and transferred to the latch C, rather than reading the information of the aggressor groups in a lump. Further, the above-described processes may be repeatedly performed on the remaining aggressor groups. As described above, since data recovery is not performed on the aggressor groups in a lump, but is repeatedly and dividedly performed on each aggressor group, in exemplary embodiments, the data recovery read operation may be performed without requiring an additional storage space even when the number of aggressor groups is increased.

In the data recovery read operation of the non-volatile memory device according to an exemplary embodiment of the present disclosure, information of a second aggressor group is read and stored in a current aggressor latch M, the same information is updated in an update aggressor latch L, a data recovery read operation for the second aggressor group is performed, read data corresponding to the second aggressor group is updated in a cache latch C using read data obtained by performing the data recovery read operation for the second aggressor group, and current aggressor information, information of a first aggressor group is read and stored in the aggressor latch M, second aggressor information is changed in the aggressor latch M using the data stored in the update aggressor latch L, the information of the first aggressor group is updated in the update aggressor latch L, and a data recovery read operation for the first aggressor group may be performed. The processes from updating the cache latch C as many times as the number of aggressor groups to performing the data recovery read operation for the first aggressor group may be repeated.

As set forth above, according to exemplary embodiments of the present disclosure, in a non-volatile memory device, a storage device including the same, and a read method thereof, the data recovery read operation may be performed without adding a latch by repeatedly performing a process of reading aggressor group information and recovering corresponding read data using the read aggressor group information on each aggressor group.

According to exemplary embodiments of the present disclosure, in a non-volatile memory device, a storage device including the same, and a read method thereof, data reliability may be increased by performing the data recovery read operation.

As is traditional in the field of the present disclosure, exemplary embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, etc., which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions.

While the present disclosure has been particularly shown and described with reference to the exemplary embodiments thereof, it will be understood by those of ordinary skill in the art that various changes in form and detail may be made therein without departing from the spirit and scope of the present disclosure as defined by the following claims.

What is claimed is:

1. A read method of a non-volatile memory device, the read method comprising:
   applying a first aggressor group read level to at least one word line adjacent to a word line selected according to an address when a read pass voltage is applied to the selected word line;
   obtaining first aggressor group information from a memory cell connected to the at least one word line;
   applying the read pass voltage to the at least one word line a first time;
   applying a first read level to the selected word line;
   performing a first read operation for a first aggressor group;
   applying a second aggressor group read level to the at least one word line when the read pass voltage is applied to the selected word line;
   obtaining second aggressor group information from the memory cell connected to the at least one word line;
   applying the read pass voltage to the at least one word line a second time;
   applying a second read level to the selected word line;
   performing a second read operation for a second aggressor group;
   applying the read pass voltage to the at least one word line a third time;
   applying a third read level to the selected word line; and
   performing a third read operation to the selected word line.

2. The read method of claim 1, wherein the first aggressor group read level is higher than the second aggressor group read level.

3. The read method of claim 2, wherein the first read level is higher than the second read level.

4. The read method of claim 1, wherein the first aggressor group read level is lower than the second aggressor group read level.

5. The read method of claim 4, wherein the first read level is lower than the second read level, and the second read level is higher than the third read level.

6. The read method of claim 1, wherein obtaining the first aggressor group information comprises:
   storing the first aggressor group information in a first latch; and
   updating, in a second latch, data stored in the first latch.

7. The read method of claim 6, wherein performing the first read operation comprises:
   storing a sensing result of the first read operation in a third latch; and
   updating, in a fourth latch, read data corresponding to the first aggressor group using the data stored in the first latch and data stored in the third latch.

8. The read method of claim 7, wherein obtaining the second aggressor group information comprises:
   storing the second aggressor group information in the first latch;
   deleting the first aggressor group information from the first latch using data stored in the second latch; and
   updating, in the second latch, the data stored in the first latch.

9. The read method of claim 8, wherein performing the second read operation comprises:
   storing a sensing result of the second read operation in the third latch; and
   updating, in the fourth latch, read data corresponding to the second aggressor group using the data stored in the first latch and the data stored in the third latch.

10. The read method of claim 1, wherein
    the memory cell is a first memory cell that stores 3-bit data,
    the first aggressor group includes a second memory cell programmed to one of a sixth programming status and a seventh programming status, and
    the second aggressor group includes a third memory cell programmed to one of a third programming status, a fourth programming status, and a fifth programming status.

11. A storage device, comprising:
    at least one non-volatile memory device; and
    a controller configured to control the at least one non-volatile memory device,
    wherein the at least one non-volatile memory device receives a read command and an address from the controller, and performs a data recovery read operation in response to the read command, and in the data recovery read operation, an operation of obtaining aggressor group information from a memory cell connected to a word line adjacent to a word line selected according to the address, and an operation of recovering data corresponding to the obtained aggressor group information in a memory cell connected to the word line selected according to the address, are repeatedly performed on each of a plurality of aggressor groups.

12. The storage device of claim 11, wherein the at least one non-volatile memory device comprises:
a first latch storing the aggressor group information in the data recovery read operation;
a second latch in which the aggressor group information is updated;
a third latch storing a result sensed from the memory cell connected to the selected word line; and
a fourth latch storing data corresponding to an aggressor group using data stored in the first latch and data stored in the third latch.

13. The storage device of claim 12, wherein in the data recovery read operation, next aggressor group information is obtained, a sensing result value obtained by performing a read operation using the next aggressor group information is stored in the first latch, and previous aggressor group information is subsequently deleted from the first latch using data stored in the second latch.

14. The storage device of claim 11, wherein the data recovery read operation includes an on-chip valley search (OVS) operation.

15. The storage device of claim 11, wherein the controller transmits, to the at least one non-volatile memory device, a data recovery read request.

16. A non-volatile memory device, comprising:
a memory cell area including a first metal pad;
a peripheral circuit area including a second metal pad and vertically connected to the first metal pad through the second metal pad;
a memory cell array including a plurality of memory blocks that each include a plurality of memory cells connected to a plurality of word lines and a plurality of bit lines in the memory cell area;
a row decoder configured to select one of the plurality of word lines in the peripheral circuit area;
a page buffer circuit including a plurality of page buffers connected to the plurality of bit lines in the peripheral circuit area; and
a control logic including a data recovery read scheduler circuit performing a data recovery read operation by receiving a command latch enable (CLE) signal, an address latch enable (ALE) signal, a chip enable (CE) signal, a write enable (WE) signal, a read enable (RE) signal, and a data strobe (DQS) signal through control pins, and latching a command or address at an edge of the WE signal according to the CLE signal and the ALE signal, in the peripheral circuit area,
wherein in the data recovery read operation, an operation of obtaining aggressor group information from a memory cell connected to a word line adjacent to a word line selected according to the address, and an operation of recovering data corresponding to the obtained aggressor group information in a memory cell connected to the word line selected according to the address, are repeatedly performed on each of a plurality of aggressor groups.

17. The non-volatile memory device of claim 16, wherein the data recovery read scheduler circuit reads first information of a first aggressor group from memory cells connected to at least one word line adjacent to the word line selected according to the address, performs a first read operation for the first aggressor group on memory cells connected to the selected word line, reads second information of a second aggressor group from the memory cells connected to the at least one adjacent word line, performs a second read operation for the second aggressor group on the memory cells connected to the selected word line, and performs a third read operation on the memory cells connected to the selected word line.

18. The non-volatile memory device of claim 17, wherein the at least one adjacent word line includes an upper word line or lower word line adjacent to the selected word line.

19. The non-volatile memory device of claim 17, wherein when reading the first information and the second information from the memory cells connected to the at least one adjacent word line, a read pass voltage is applied to the selected word line.

20. The non-volatile memory device of claim 16, wherein in the data recovery read operation, data corresponding to a corresponding one of the plurality of aggressor groups is recovered, and the recovered data is transmitted to a cache latch for outputting the recovered data to an input/output buffer.

* * * * *